US006560505B1

(12) United States Patent
Kikuchi et al.

(10) Patent No.: US 6,560,505 B1
(45) Date of Patent: May 6, 2003

(54) AUTOMATIC PARTS PLACEMENT SYSTEM, METHOD, AND MEDIUM

(75) Inventors: Hideo Kikuchi, Tokyo (JP); Arata Yato, Tokyo (JP)

(73) Assignee: NEC Toppan Circuit Solutions, Inc. (JP)

( * ) Notice: Subject to any disclaimer, the term of this patent is extended or adjusted under 35 U.S.C. 154(b) by 0 days.

(21) Appl. No.: 09/523,300

(22) Filed: Mar. 10, 2000

(30) Foreign Application Priority Data

Mar. 12, 1999 (JP) .......................................... 11-066793

(51) Int. Cl.⁷ .............................................. G06F 19/00
(52) U.S. Cl. .............................. 700/121; 716/7; 716/10; 716/12; 716/8
(58) Field of Search ................................. 700/121, 160, 700/117, 90, 95–97; 716/2, 5, 7–14

(56) References Cited

U.S. PATENT DOCUMENTS

| | | | | |
|---|---|---|---|---|
| 5,850,349 A | * | 12/1998 | Hirai et al. .................... | 716/12 |
| 5,892,688 A | * | 4/1999 | Scepanovic et al. ........... | 716/2 |
| 6,161,056 A | * | 12/2000 | Sato ........................... | 700/193 |
| 6,240,541 B1 | * | 5/2001 | Yasuda et al. ................. | 716/6 |
| 6,438,736 B1 | * | 8/2002 | Zahar .......................... | 716/12 |
| 6,446,239 B1 | * | 9/2002 | Markosian et al. ............ | 716/2 |
| 6,449,761 B1 | * | 9/2002 | Greidinger et al. ........... | 716/11 |

FOREIGN PATENT DOCUMENTS

| JP | 3-108739 | 5/1991 |
|---|---|---|
| JP | 3-124046 | 5/1991 |
| JP | 6-149939 | 5/1994 |
| JP | 6-332983 | 12/1994 |
| JP | 6-332984 | 12/1994 |

OTHER PUBLICATIONS

"Proposal of a Limited Slice Structure that Solves Model Placement Problems", Denshi Joho Tsushin Gakkai Gijutsu Kenyu Hoko, Denshi Joho Tsushin Gakkai, Oct. 1994, vol. 94, No. 315 (VLD94–66) p. 19–24.

"Proposal of Placement Schematic Wiring Simultaneous Optimization Method Based on BSG Structure", Denshi Joho Tsushin Gakkai Gijutsu Kenkyu Hoko, Denshi Joho Tsushin Gakkai, Jun., 1997, vol. 97, No. 139 (VLD97–40) p. 175–182.

"Printed Circuit Board Layout Compaction", Electronics Jisso Gakkai–shi, Electronics Jisso Gakkai, May 1999, vol. 2, No. 3, p. 168–172.

* cited by examiner

*Primary Examiner*—Leo Picard
*Assistant Examiner*—Chad Rapp
(74) *Attorney, Agent, or Firm*—Hayes Soloway P.C.

(57) ABSTRACT

An automatic parts placement system is provided which is capable of placing parts in proper positions, in a short time, on a printed wiring board to realize the shortest total wiring length. Parts are each added to a parts group which is generated based on a position designated part and parts specific gravity of the part is determined. The heavier parts specific gravity of part is placed in the closer position relative to the position designated part, by applying actual specific gravity in physical phenomenon.

34 Claims, 26 Drawing Sheets

2001 NET DATA

| |
|---|
| 1001 NET NAME |
| 1002 PARTS NAME |
| 1003 PARTS TERMINAL NUMBER |

FIG. 2A

2002 PARTS (CLUSTER) DATA

| |
|---|
| 1002 PARTS NAME |
| 1004 TYPE OF SHAPE |
| 1005 SIZE OF SHAPE |
| 1006 AREA OF PARTS |
| 1007 COORDINATE VALUES OF PARTS PLACEMENT |
| 1008 1ST ELEMENT PART NAME |
| 1016 COORDINATE VALUES OF RELATIVE POSITION OF 1ST PART |
| 1008 2ND ELEMENT PART NAME |
| 1016 COORDINATE VALUES OF RELATIVE POSITION OF 2ND PART |
| . . . |
| 1008 n-TH ELEMENT PART NAME |
| 1016 COORDINATE VALUES OF RELATIVE POSITION OF n-TH PART |
| 1009 UPPER CLASS NAME |
| 1011 PARTS GROUP NAME OF PART (PARTITION NAME) |

FIG. 2B

2003 NET AGGREGATION DATA

| |
|---|
| 1001 NET NAME |
| 1002 1ST PART NAME |
| 1003 PART TERMINAL NUMBER |
| 1002 2ND PART NAME |
| 1003 PART TERMINAL NUMBER |
| . . . |
| 1002 n-TH PART NAME |
| 1003 PART TERMINAL NUMBER |

FIG. 2C

2004 CLASS ONE PARTS SPECIFIC GRAVITY DATA

| |
|---|
| 1002 PARTS NAME |
| 1011 GRAVITY SOURCE PARTS GROUP |
| 1010 PARTS SPECIFIC GRAVITY |

FIG. 3A

2005 PARTITION DATA

| |
|---|
| 1011 PARTITION NAME OR PARTS GROUP NAME |
| 1012 COORDINATE VALUES OF LEFT SIDE BOUNDARY LINE |
| 1012 COORDINATE VALUES OF RIGHT SIDE BOUNDARY LINE |
| 1012 COORDINATE VALUES OF UPPER SIDE BOUNDARY LINE |
| 1012 COORDINATE VALUES OF LOWER RIGHT SIDE BOUNDARY LINE |
| 1002 1ST PART NAME |
| 1002 2ND PART NAME |
| . . . |
| 1002 n-TH PART NAME |

FIG. 3B

2006 ONE-DIMENSIONAL PARTS SPECIFIC GRAVITY DATA

| |
|---|
| 1002 PARTS NAME |
| 1011 PARTITION NAME OR DIVIDED ZONE NAME |
| 1013 DIRECTION OF ONE-DIMENSIONAL COORDINATE AXIS |
| 1014 DIVISION LINE POSITION COORDINATE |
| 1015 ONE-DIMENSIONAL PARTS PLACEMENT POSITION |
| 1010 PARTS SPECIFIC GRAVITY |

FIG. 3C

2007 ONE-DIMENSIONAL PARTS PLACEMENT DATA

| |
|---|
| 1011 PARTITION NAME |
| 1013 DIRECTION OF ONE-DIMENSIONAL COORDINATE AXIS |
| 1002 1ST PART NAME |
| 1015 ONE-DIMENSIONAL PARTS PLACEMENT POSITION OF 1ST PART |
| 1002 2ND PART NAME |
| 1015 ONE-DIMENSIONAL PARTS PLACEMENT POSITION OF 2ND PART |
| . . . |
| 1002 n-TH PART NAME |
| 1015 ONE-DIMENSIONAL PARTS PLACEMENT POSITION OF n-TH PART |

FIG. 3D

2008 ONE-DIMENSIONAL CLUSTER DATA

| | |
|---|---|
| 1011 | NUCLEUS POSITION DESIGNATED PART NAME |
| 1013 | DIRECTION OF ONE-DIMENSIONAL COORDINATE AXIS |
| 1016 | ORDER OF PARTS PLACEMENT OF 1ST PART |
| 1002 | 1ST PART NAME |
| 1016 | ORDER OF PARTS PLACEMENT OF 2ND PART |
| 1002 | 2ND PART NAME |
| | . . . |
| | . . . |
| 1016 | ORDER OF PARTS PLACEMENT OF n-TH PART |
| 1002 | n-TH PART NAME |

FIG. 19

AUTOMATIC PARTS PLACEMENT SYSTEM, METHOD, AND MEDIUM

BACKGROUND OF THE INVENTION

1. Field of the Invention

The invention relates to an automatic placement system and method for parts and, in particular, to an automatic parts placement system and method each of which is suitable to be used in, for example, a CAD (computer aided design) system automatically placing parts, figures, or the like on a plane.

2. Description of the Related Art

Some of parts placement methods applied to a previous printed wiring board or a previous semiconductor integrated circuit are disclosed in documents. For example, a parts placement optimizing method is disclosed in Japanese Laid Open Publication No. H06-332983 (namely, 332983/1994, U.S. Pat. No. 5,600,555). With this method, it is possible to determine, in a short time, parts placement which provides a comparatively low valuation standard, such as a total wiring length. Hereinafter, the document will be referred to as "document 1". Specifically, the parts placement optimizing method virtually converts parts into uniform size of blocks or a set of blocks (initial placement), and replaces blocks in the blocks or in the set of blocks. As a result, the method improves the parts placement so that the valuation reference such as a total wiring length may become small as possible, and finally returns the virtually converted blocks to real parts.

The method may be implemented through a program in a computer system which includes an input device, such as a keyboard, a display device such as a CRT display, and a data processing device having a CPU, a memory, and a hard disk.

Further, disclosure is made in Japanese Laid Open Publication No. H03-108739 (namely, 108739/1991, U.S. Pat. No. 5,309,371) about an integrated circuit blocks placement method of placing variant size of blocks and determining a wiring between the blocks. The document will be, hereinafter, referred to as "document 2".

The method initially places the blocks using a mass system spring model in which each of circuit blocks is assumed to be connected to the other circuit blocks by a spring with the block size neglected. It may be said that energy of the dynamic model corresponds to sums of squares of net lengths. Under the above-assumption, the initial placement is made such that the energy may become minimum by using a method of placing the parts in a gravity point (barycenter).

Then, the parts or circuit blocks are approximated by circles which have block sizes to calculate placement of each circle. Thereafter, the circles are transformed to the real configurations of the blocks to replace the blocks so that there are no overlaps among the blocks. In other words, the method compacts the blocks along with a frame of a circuit board and modifies the shape of each block from the circular figure to the actual shape.

Finally, the method assigns a zone for wiring by swelling the blocks and adjusts an aspect ratio of each block in a tolerance level.

Similarly, a method disclosed in Japanese Laid Open Publication No. H03-124046 (namely, 124046/1991, U.S. Pat. No. 5,309,371) utilizes the mass system spring model and performs the similar initial placement as described above. Herein, the document is referred to as "document 3".

Furthermore, disclosure is made in Japanese Laid Open Publication No. H06-332984 (namely, 332984/1994) about an element placement method which is capable of determining an optimum solution in a short time without exchanging two elements. The document is, hereinafter, referred to as "document 4".

The method comprises the steps of (1) determining a gravity point of each net, (2-1) determining an average vector by determining vectors from each terminal position and by averaging the vectors, (2-2) determining a position to which the element is moved based on the average vector, (3) determining a permutation of the elements according to coordinate values of the position, and (4) determining a matrix structured placement of the elements so that there are no overlaps between elements in consideration of the shapes of the elements and a matrix structured initial placement placing the elements according to the determined permutation.

As described above, the method of the document 1 determines an optimum parts placement so that the total wiring length becomes minimum. The total wiring length is defined as a sum of Manhattan distances between parts elements connected by the net.

On the other hand, the method of the document 2 and the method of the document 4 use the sums of squares of distances between the parts elements connected through the net to determine an optimum parts placement.

However, there is no analytical solution against a problem of finding the above optimum parts placement. Therefore, to find an optimum solution, a method has been adopted which selects a combination which has a minimum value among total wiring lengths obtained by calculating all combinations of possible parts placements.

But, the number of combinations becomes equal to N! (N is the number of the parts). In consequence, an amount of computations required to find the optimum solution increases explosively as the number N increases.

Therefore, parts placement algorithm of finding a solution close to an optimum solution in a short time has been developed.

As described above, the prior method of repeatedly selecting parts placement by exchanging parts so as to shorten its own total wiring length causes critical placements to occur such that no reduction is possible. There are often a plurality of critical parts placements. Once a solution is found which corresponds to such a critical parts placement, any other optimum solutions can not be found, although there is another optimum solution which leads to less total wiring length. This problem is known as local stabilization.

Here, to avoid the local stabilization and to determine an optimum solution, a simulated annealing method may be simultaneously used. The method applies a principle of leaving from a state of local stabilization using state transition of disturbance in heating a molecule, to search of parts placement. That is, some solutions are generated by random modification, and then, the most improved solution (for example, a solution which leads to less total wiring length) is selected among these solutions.

Also, a method has been known which improves a solution by repeating steps of generating "descendant" solutions resulting from random disturbance of a part of initially obtained solutions based on genetic algorithm, and selecting the most improved solution among the "descendant" solutions.

However, the parts placement system using the simulated annealing method or the genetic algorithm still has a problem that an operation time is incomparably larger than a time needed for determining a solution by the pair exchange method.

This is because the system using the simulated annealing method or the genetic algorithm has many and complex procedures. Specifically, the system generates a large number of solutions which are slightly different from each other using the random disturbance, determines improved solutions using the pair exchange method based on each of the generated solutions, generates a large number of solutions again by disturbing the improved solutions, and estimates the finally generated solutions.

There are two substantial points in the system. A first point is that the disturbance process should be performed appropriately and in a fully broad range not to miss a path to an optimum solution. A second point is that convergence process should be completely performed so as to converge the randomly disturbed solutions.

Consequently, to obtain a solution closer to an optimum solution, it is required to perform as much fully disturbance process as possible and perform complete convergence process to convergence the disturbance. Thus, if one would obtain more proper solution, a longer operation time is required.

On the other hand, in the methods disclosed in the document 2 through the document 4, since each of the methods uses the mass system spring model, a shorter operation time is realized. However, in the mass system spring model, it is not possible to distinguish a large size of block from a small size of block. In this case, there is a problem that a given solution does not reflect an influence from the size of the block.

Next, description is made about a second problem. The method of the document 4 (hereinafter, the method is referred to as "gravity point method"), which places the parts in a gravity point of the net, does not always reach the shortest total wiring length. For example, assuming that a first part is connected to the leftmost of a substrate via two nets and connected to the rightmost of the substrate via a single net, a gravity point of the first part is placed in a position far from the leftmost of the substrate by the distance of ⅓ of the width of the substrate toward the rightmost of the substrate. Also, assuming that a second part is connected to the leftmost of a substrate via six nets and connected to the rightmost of the substrate via four nets, a gravity point of the second part is placed in a position far from the leftmost of the substrate by the distance of ⅖ of the width of the substrate toward the rightmost of the substrate. Therefore, the position of the gravity point of the second part is placed between the leftmost of the substrate and the gravity point of the first part.

Here, to obtain the shortest total wiring length, the second part should be located in the left side of the first part, since the difference between the number of the nets connected to the leftmost of the substrate and the number of the nets connected to the rightmost of the substrate is equal to two and therefore the difference is larger than that of the first part by 1.

However, the gravity point method can not provide a proper conclusion.

Further, in the gravity point method, since a contribution from a far side of terminal of a part is considered as proportionate to square of the distance, a weight from a far part is greater than a weight from a near part. Therefore, the method is not suitable to directly obtain parts placement which realizes a short total wiring length.

To overcome the first problem and the second problem, a method disclosed in Japanese Laid Open Publication No. H06-149939 (namely, 149939/1994, and referred to as "document 5") has been proposed by the applicant of the invention.

The method considers the number of wiring from a part as attractive force and determines a (pseudo) parts specific gravity or relative weight by dividing the attractive force by an area of the part. Next, the method places parts on a single dimension in ascending order of the corresponding parts specific gravity. Thus, the method determines two one-dimensional parts placements and generates a two-dimensional parts placement (schematic parts placement) in which one of the one-dimensional parts placement is projected to the X-axis and the other is projected to the Y-axis. In other words, the method produces the optimum schematic parts placement (initial parts placement) by freely modifying placement of parts or a set of parts.

However, in the method, since the schematic parts placement is incomplete, it is not possible to design placement using only the schematic parts placement.

SUMMARY OF THE INVENTION

Therefore, it is an object of the invention to provide an automatic parts placement device and its method which are capable of placing parts in proper positions based on the schematic parts placement according to actual shapes of the parts, and completing parts placement which is possible to be directly used for subsequent design.

Further, it is another object of the invention to provide an automatic parts placement device and its method which are capable of performing calculation of parts placement which realizes the shortest total wiring length without repeating trial and error for exchanging of parts positions. Therefore, according to the automatic parts placement device and its method of the invention, calculation for placement of all the parts is performed once, and parts placement which is approximate to the shortest total wiring length is obtained in a short time.

Also, other objects, features, and merits will become clear from the following description.

Hereinafter, principles of the system according to the invention will be described. At first, position data of a plurality of position designated parts are supplied to the system. Then, parts are each added to one of parts groups each of which is generated based on one of the position designated parts using the supplied position data. This process is performed by the following steps (1) to (3).

(1) Determining Parts specific gravity or relative weight by dividing the number of nets which connect a part to a parts group, by the area of the part. The determined parts specific gravity is considered as actual specific gravity in physical phenomenon.

(2) Extracting a combination of a part and a parts group which provide the maximum parts specific gravity and adding the part to the parts group. Thus, parts groups are formed by adding parts around the position designated part.

(3) Repeating the addition process until all the parts are added to any one of the parts groups.

Also, in the above steps (1) to (3), each parts group is formed by grouping parts on the basis of a position designated part. But, in the other embodiment of the invention, each parts group may be determined by instructions from an input unit (such as a later described input unit 103 of the invention) in response to an operator.

Next, partitioned zones (hereinafter, referred to as "partitions") each of which corresponds to a parts group are generated. Partitions are formed based on an area of the corresponding parts group.

Each partition has a rectangular shape. As mentioned before, the term "partition" means a partitioned section or zone on a two-dimensional plane of parts placement zone rather than a room in a three-dimensional space.

Then, parts specific gravity is calculated on two-dimensional plane of the X-Y coordinate for each partition. The parts specific gravity is calculated for an inclined line which descends rightwards at an angle of 45 degrees relative to the X axis (a first one-dimensional axis). That is, a sum of lengths of nets connecting between the parts is calculated by projecting the nets towards the inclined line and may be considered as potential. energy in physical phenomenon.

Placement which makes the total wiring length minimum is determined by calculating a first one-dimensional parts placement position which places the parts along the first one-dimensional coordinate in the descending order of the parts specific gravity. This means that a real physical phenomenon is simulated wherein placement for minimizing potential energy of materials is determined by placing materials in an order from heavier specific gravity to lighter one from downside position.

Then, like in the above process, parts specific gravity is calculated for another inclined line which ascends rightwards at an angle of 45 degrees relative to the X axis (a second one-dimensional axis, which is perpendicular to the first one-dimensional axis). And a second one-dimensional parts placement position is determined by placing the parts along the second one-dimensional coordinate in the descending order of the parts specific gravity.

Thereafter, from the first one-dimensional parts placement position and the second one-dimensional parts placement position for the parts, parts placement position on the two-dimensional plane is produced. One of the coordinate axes of the two-dimensional parts plane descends rightwards at an angle of 45 degrees relative to the X axis of the partition and is related to the first one-dimensional parts placement position. The other axis ascends rightwards at an angle of 45 degrees relative to the X axis of the partition and is related to the second one-dimensional parts placement position.

Then, parts groups each of which is placed on the two-dimensional plane are included in the corresponding partition. In the partition, the parts in the parts group are further placed.

A first method of placing the parts in the parts group includes the step of placing the parts in the partition by using compaction process.

A second method includes the steps of determining a quadrilateral shape which includes all the parts in the parts group (the shape of the quadrilateral is not limited to rectangular shape), transforming coordinate values to map the quadrilateral to the rectangular shape of partition, and determining parts placement position from the result of mapping.

Then, vertical division lines which divide the parts in the partition into left side parts and right side parts on the two-dimensional plane are produced. Further, horizontal division lines are produced to divide the parts in the partition into upside parts and downside parts on the two-dimensional plane. Next, the vertical and horizontal division lines are helpful to define zones each of which corresponds to a part in the partition according to the area of the part.

Then, the part is assumed to be placed in the center of the corresponding zone.

According to a first aspect of the invention, an automatic parts placement system is provided. The system comprises (1) a storage device which stores net data of a net connecting between terminals of parts, parts data, and position data of position designated parts, (2) a deriving unit which derives parts group from a plurality of parts, (3) a partition producing unit which divides a parts placement zone into a plurality of partitions according to the total area of all the parts in the parts group, each partition having a predetermined shape and being related to the parts group, (4) a parts specific gravity calculating unit which calculates, for each partition, a parts specific gravity of a undefined part by subtracting, from the number of nets connecting between placed parts and the undefined part in the partition, the number of the other nets connected to the undefined part, and by dividing the result of subtracting by the area of the undefined part, (5) a one-dimensional placing unit which places the undefined parts nearby the placed part in the descending order of the parts specific gravity on a first one-dimensional axis to produces a first one-dimensional parts placement, and which places the undefined parts adjacent to the placed part in the descending order of the parts specific gravity on a second one-dimensional axis perpendicular to the first one-dimensional axis to produces a second one-dimensional parts placement, and (6) a two-dimensional placing unit which places, for each partition, the undefined parts on a two-dimensional plane by using the first one-dimensional parts placement and the second one-dimensional parts placement.

Further, according to a second aspect of the invention, an automatic parts placement device which automatically places parts on two-dimensional parts placement zone is provided. The device comprises (1) a part data input device which inputs shapes and areas of the parts and net data of nets connecting between the parts, and stores them to a storage device, (2) an operational instruction input device which designates placement position of a position designated part in response to an operational instruction, (3) a cluster producing unit which produces a cluster including parts each of which has strong net connectivity, (4) a first parts specific gravity calculating unit which derives a parts specific gravity for each combination of a part and a parts group, (5) a parts group producing unit which adds a part to a parts group having a plurality of parts around the position designated part, (6) a re-distributing unit which moves a part from a current parts group to another parts group which has stronger connectivity to the part, (7) a partition producing unit which produces a rectangular shape of partition by dividing a parts placement zone according to a ratio of an area of the parts group, (8) a one-dimensional parts specific gravity calculating unit which calculates a parts specific gravity based on the number of nets connecting in the direction of a one-dimensional coordinate axis of the part, (9) a one-dimensional lining unit which lines the parts on a first one-dimensional coordinate axis in order of the parts specific gravity to store the parts placement as first one-dimensional parts placement, and lines the parts on a second one-dimensional coordinate axis perpendicular to the first one-dimensional coordinate axis in order of the parts specific gravity to store the parts placement as second one-dimensional parts placement, (10) a two-dimensional part placing unit which schematically places the part using the first one-dimensional parts placement and the second one-dimensional parts placement, (11) a layout mapping unit which maps, for each partition, parts placement to the partition by determining a quadrilateral including all the parts schematically placed by the two-dimensional part placing unit, and by transforming the quadrilateral to the partition, and (12) a partition dividing unit further divides the parts placement mapped by the layout mapping unit into a plurality of zones for each part, and places the parts in the divided zones.

Further, according to a third aspect of the invention, an automatic parts placement device which automatically places parts on two-dimensional parts placement zone is provided. The device comprises (1) a part data input device which inputs shapes and areas of the parts and net data of nets connecting between the parts, and stores them to a storage device, (2) an operational instruction input device which designates placement position of a position designated part in response to an operational instruction, (3) a cluster producing unit which produces a cluster including parts each of which has strong net connectivity, (4) a first parts specific gravity calculating unit which derives a parts specific gravity for each combination of a part and a parts group, (5) a parts group producing unit which adds a part to a parts group having a plurality of parts around the position designated part, (6) a re-distributing unit which moves a part from a current parts group to another parts group which has stronger connectivity to the part, (7) a partition producing unit which produces a rectangular shape of partition by dividing a parts placement zone according to a ratio of an area of the parts group, (8) a second one-dimensional parts specific gravity calculating unit calculates a parts specific gravity based on the number of nets connecting in the X-axis direction of the XY coordinate two-dimensional plane or in the Y-axis direction of the XY coordinate two-dimensional plane, (9) a second one-dimensional lining unit which lines the parts along the X-axis in order of the parts specific gravity to store the parts placement as first one-dimensional parts placement, and lines the parts along the Y-axis perpendicular to the X-axis in order of the parts specific gravity to store the parts placement as second one-dimensional parts placement, (10) a second two-dimensional part placing unit which schematically places the part on the XY coordinate two-dimensional plane using the first one-dimensional parts placement and the second one-dimensional parts placement, (11) a second partition dividing unit further divides the parts placement zone into a plurality of an individual part zones using a first lines parallel to the X-axis and a second lines parallel to the Y-axis, the lines being defined with the interval of the minimum area of the part, and (12) a parts replacing unit which replaces the part by moving the part to another individual part zone so that there is one or no part in every individual part are.

Further, according to a fourth aspect of the invention, a method of automatically placing parts is provided. The method comprises the steps of (a) inputting net data of a net connecting between terminals of parts, parts data, and position data of position designated parts, (b) deriving parts group from a plurality of parts, (c) producing a partition by dividing a parts placement zone into a plurality of partitions according to the total area of all the parts in the parts group, each partition having rectangular shape and being related to a parts group, (d) calculating a parts specific gravity of a undefined part, for each partition, by subtracting from the number of nets connecting between placed parts and the undefined part in the partition, the number of the other nets connected to the undefined part, and by dividing the result of subtracting by the area of the undefined part, (d') determining a first one-dimensional parts placement by placing the un-placement parts nearby the placed part on a first one-dimensional axis in the descending order of the parts specific gravity, (e) determining a second one-dimensional parts placement by placing the undefined parts nearby the placed part on a second one-dimensional axis perpendicular to the first one-dimensional axis in the descending order of the parts specific gravity, and (f) determining parts placement on a two-dimensional plane by placing, for each partition, the undefined parts on a two-dimensional plane using the first one-dimensional parts placement and the second one-dimensional parts placement.

Further, according to a fifth aspect of the invention, a recording medium tangibly embodying a program of instructions executable by the computer to perform a method of automatically placing parts is provided. The method comprises the steps of (a) inputting net data of a net connecting between terminals of parts, parts data, and position data of position designated parts, (b) deriving parts group from a plurality of parts, (c) producing a partition by dividing a parts placement zone into a plurality of partitions according to the total area of all the parts in the parts group, each partition having rectangular shape and being related to a parts group, (d) calculating a parts specific gravity of a undefined part, for each partition, by subtracting from the number of nets connecting between placed parts and the undefined part in the partition, the number of the other nets connected to the undefined part, and by dividing the result of subtracting by the area of the undefined part, (d') determining a first one-dimensional parts placement by placing the un-placement parts nearby the placed part on a first one-dimensional axis in the descending order of the parts specific gravity, (e) determining a second one-dimensional parts placement by placing the undefined parts nearby the placed part on a second one-dimensional axis perpendicular to the first one-dimensional axis in the descending order of the parts specific gravity, and (f) determining parts placement on a two-dimensional plane by placing, for each partition, the undefined parts on a two-dimensional plane using the first one-dimensional parts placement and the second one-dimensional parts placement.

The above described functions or processes are realized by programs executed on a computer. The programs may be supplied to the computer via an input device from a computer readable medium storing the programs. The programs are loaded to a main memory of the computer before execution.

BRIEF DESCRIPTION OF THE DRAWINGS

FIGS. 2A–2C show layouts of data used in the first embodiment of the invention;

FIGS. 3A–3D show layouts of other data used in the first embodiment of the invention;

FIG. 19 shows layouts of data used in the second embodiment of the invention;

DESCRIPTION OF THE PREFERRED EMBODIMENT

Figure 1:
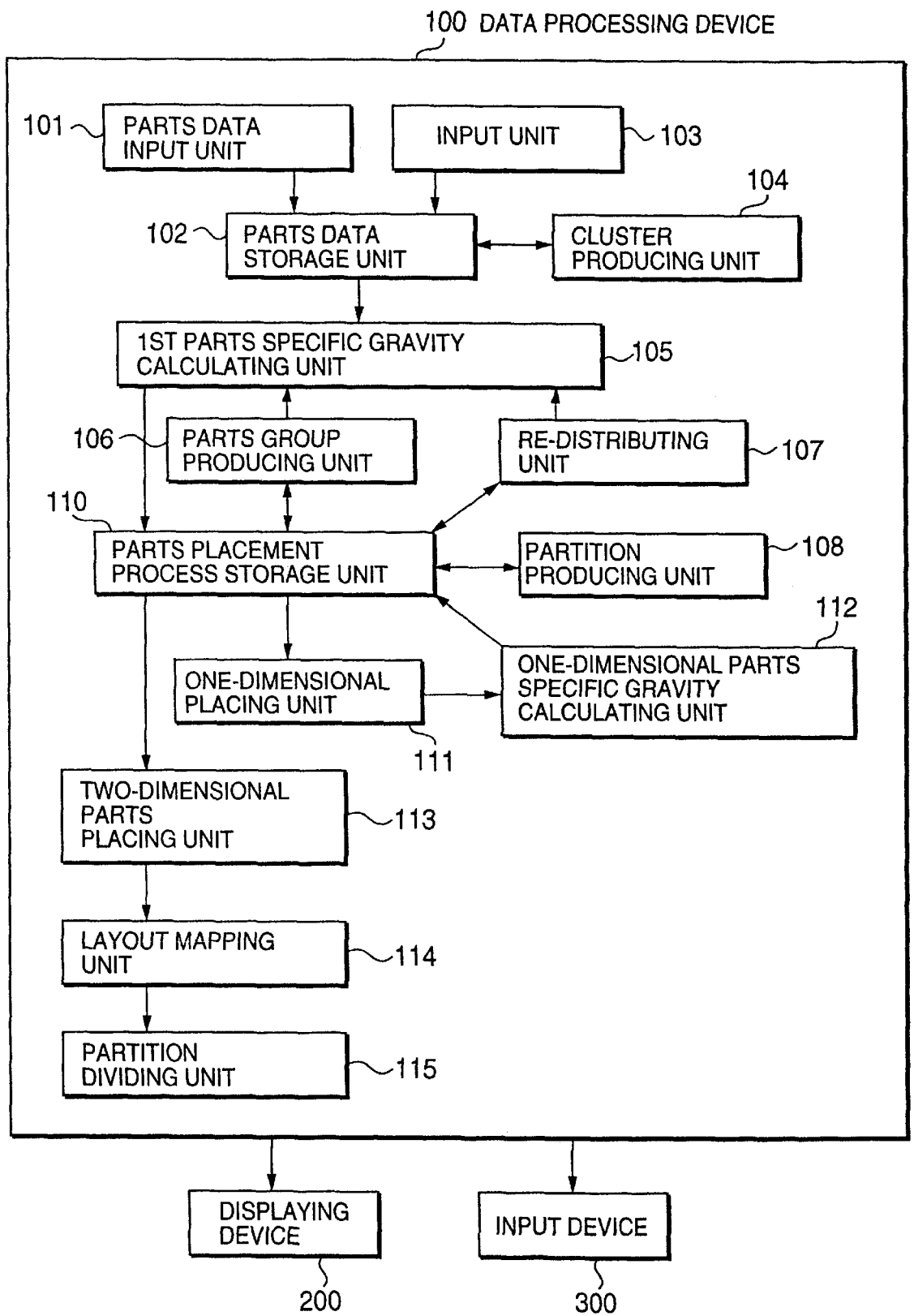
FIG. 1 shows a configuration of a first embodiment of the invention.

In FIG. 1, an automatic parts placement device of a first embodiment of the invention includes a data processing device 100, a display device 200, and an input device 300. These devices are controlled by a program. Also, hereinafter, description is made about an example of the invention which is applied to a system placing parts on a printed wiring board.

The data processing device 100 includes a parts data input unit 101, a parts data storage unit 102, an input unit 103, a cluster producing unit 104, a first parts specific gravity calculating unit 105, a parts group producing unit 106, a re-distributing unit 107, a partition producing unit 108, a parts placement process storage unit 110, a one-dimensional placing unit 111, a one-dimensional parts specific gravity calculating unit 112, a two-dimensional parts placing unit 113, a layout mapping unit 114, and a partition dividing unit 115.

Hereinafter, each unit is described schematically.

The parts data input unit 101 is supplied with data relating to shape and area of parts and stores them into the parts data storage unit 102. Also, net data are stored into the unit 102. And the net data includes a net name and a parts terminal name which is connected to a net of the net name. The net data defines parts terminals which should be connected to each other at the same electric potential for each net name.

The input unit 103 determines a placement position of a position designated part in response to an instruction of an operator. The operator provides instructions to the unit 103 by manipulating a mouse and selecting a part on a screen of the display device 200, for example, drugging the mouse on the screen and moving a location of the objective parts on the screen.

The cluster producing unit 104 produces a cluster including a combination of parts which are strongly related to one another in net.

The first parts specific gravity calculating unit 105 calculates a parts specific gravity for each combination of the part and parts group.

The parts group producing unit 106 classifies each part into parts groups each of which has position designated parts as nuclei and other parts.

The re-distributing unit 107 moves a part from a parts group to another parts group stronger in relationship.

The partition producing unit 108 produces rectangular partitions by dividing a parts placement zone on a printed wiring board according to a ratio of areas among parts groups.

The one-dimensional placing unit 111 lines the parts in an ascending order of its specific gravity and stores the order of one-dimensional parts placement to the parts placement process storage unit 110. In this specification, the ascending order of the specific gravity means the order from lighter specific gravity to heavier one. On the contrary, the descending order of the specific gravity means the order from heavier specific gravity to lighter one.

The one-dimensional parts specific gravity calculating unit 112 calculates a specific gravity with reference to the number of nets which connect parts in the direction of the axis of the one-dimensional parts placement.

The two-dimensional parts placing unit 113 calculates coordinate values at two-dimensional oblique coordinate axes of each position of the part based on a first parts positions from a first one-dimensional parts placement and a second parts positions from a second one-dimensional parts placement. Thus, the unit 113 serves to approximately place the parts on a two-dimensional plane according to the coordinate values.

The layout mapping unit 114 calculates any rectangular shapes (not limited to a square) surrounding the approximately placed parts within each partition, and performs coordinate transformation which maps the calculated rectangle onto the partition. As a result, parts placement is mapped into the partitions.

The partition dividing unit 115 divides each partition into zones included parts and places the parts in the corresponding zones.

Next, overall operation of the first embodiment of the invention will be described with reference to FIG. 1 to FIG. 17.

Figure 4:
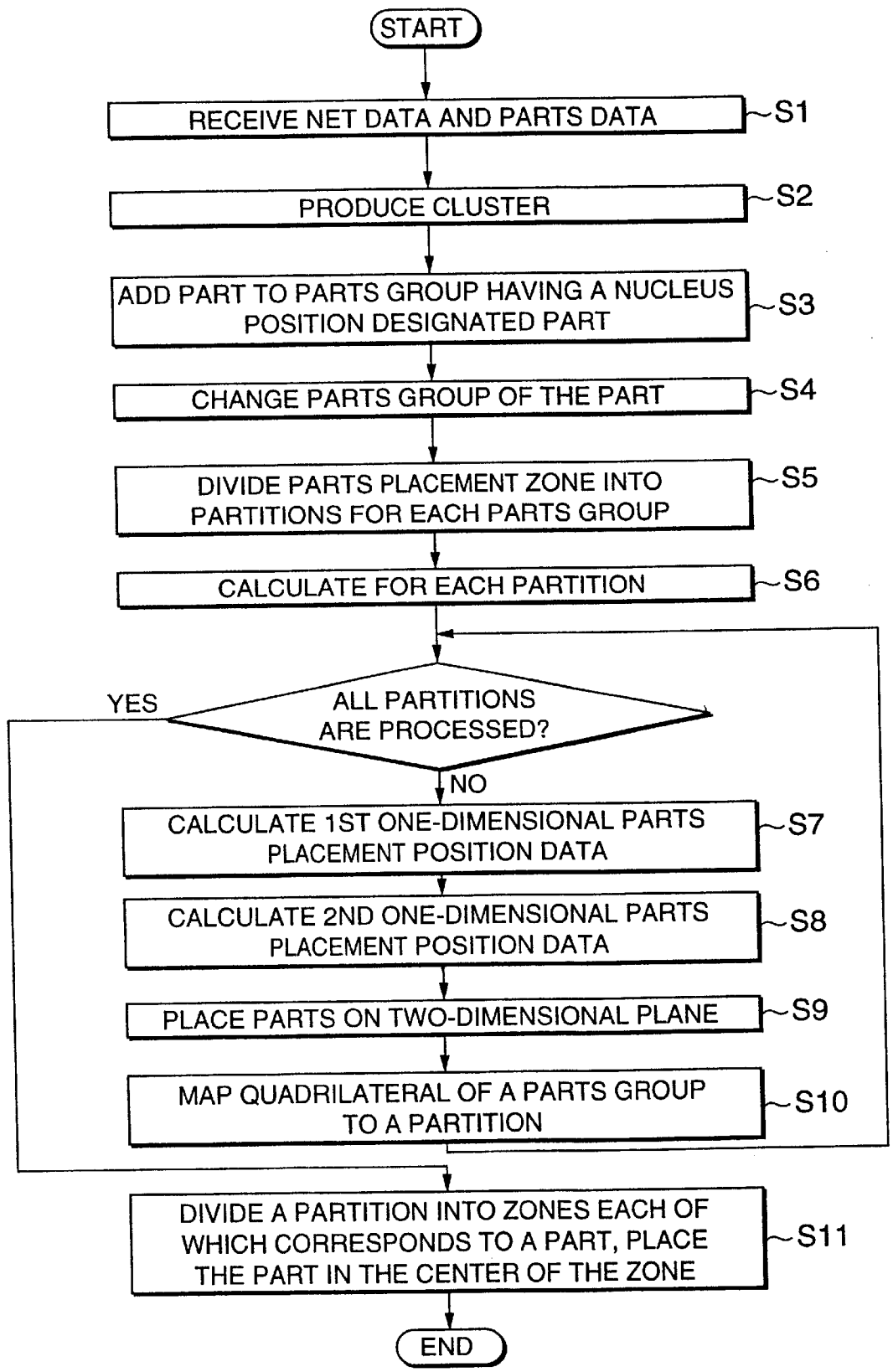
FIG. 4 shows a flowchart of the first embodiment of the invention.

At first, description is made about a flowchart of the first embodiment shown in FIG. 4.

In step S1, net data 2001 including a net name 1001, a parts name 1002, and a parts terminal number 1003 as shown in FIG. 2A are supplied to the parts data input unit 101. Then, the parts data input unit 101 produces parts data 2002 and stores it into the parts data storage unit 102. The parts data includes, as shown in FIG. 2B, a parts name 1002, a type of shape 1004, a size of shape 1005, an area of parts 1006, coordinate values of parts placement position 1007, and other required data.

Further, the parts data input unit 101 produces net aggregation data 2003 including, as shown in FIG. 2C, combinations of a parts name 1002 and a parts terminal number 1003 in a net for each net name 1001.

The input unit 103 places a part whose placement position is designated in advance on a printed wiring board or places a part as a nucleus element on the basis of designer's parts placement plan, in response to instructions from an operator.

Figure 5:
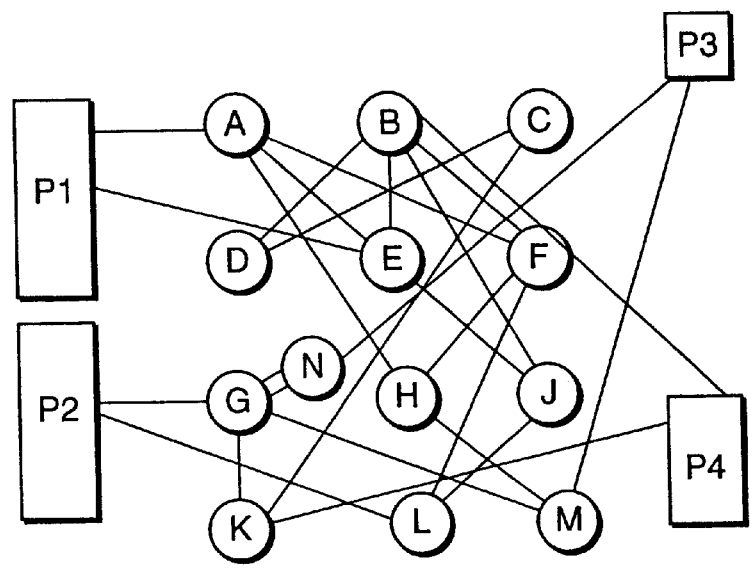
FIGS. 5 through 17 show specific operations of the first embodiment of the invention.

In FIG. 5, position designated parts are denoted by rectangles. On the other hand, the other parts (undefined parts) are denoted by circular shapes. Further, terminals of parts which belong to a net (net name 1001) are connected to one another by lines or wires.

Referring back to FIG. 4, it is assumed in step S2 that the cluster producing unit 104 determines the number of common nets connecting one of the undefined parts (referred to as "part 1") to other parts (parts 2) is larger than the number of nets connecting to any different parts (other than the part 1 and parts 2). In this event, the unit 104 produces, as parts data 2002, a cluster which includes a combination of the parts 1 and 2 and stores the cluster into the parts data storage 102.

Data related to a shape of a part included in the cluster (parts data 2002) is kept undecided. Data related to an area of each part stands for a sum of areas of the parts 1 and 2. Further, the parts names are each set to the corresponding element parts name 1008.

An upper class name 1009 is given or set to parts data 2002 of a part which serves as an element of a cluster. Hereinafter, the cluster is collectively handled as one of parts and the parts data 2002 concerned with the cluster is used when the cluster is classified into elements.

Next, in step S3, the first parts specific gravity calculating unit 105 selects each of parts undefined in the parts groups and calculates a specific gravity for each combination of the undefined parts (hereinafter, referred to as "independent parts group") and each parts group (may be called gravity source parts group) including the parts designated in positions. Such a calculation of specific gravity or gravity of the parts is carried out by using the following equation (1). Specifically, the above calculation is performed by subtracting the number of nets which connect the part to the other parts, from the number of nets which connect the part to the gravity source parts group. The result of the calculation is then divided by an area of the independent part and the resulting quotient is set to a parts specific gravity 1010 which stands for a degree that the part is attracted to the gravity source pats group. Then, as shown in FIG. 3A, the parts specific gravity 1010, a parts name 1002, and a gravity source parts group name 1010 are set in a class one parts specific gravity 2004 and stored in the parts placement process storage 110.

The parts specific gravity 1010 which means a degree that a part is attracted to the gravity source parts group and is given by:

$$([\text{the number of nets which connect the part to the gravity source parts group}] - [\text{the number of nets which connect the part to the other parts}])/[\text{an area of the part}] \quad (1).$$

Herein, when net aggregation data 2003 for an aggregation of parts stores parts connected to the gravity source parts group and any other parts, the nets concerned with the above-mentioned parts are cancelled on the calculation of the equation.

The parts group producing unit 106 is given a combinations which include the undefined parts and the gravity source parts group and extracts a maximum parts specific gravity 1010 among thus calculated parts specific gravities 1010.

Then, the undefined part is added to the gravity source parts group and the parts group name 1011 is set in the parts data 2002. Thus, the parts group which has the position designated parts as the nucleus increases its members.

Next, the parts group producing unit 106 selects the net aggregation data 2003 of parts previously recorded and, further, extracts an independent part in the net aggregation data 2003. After that, the first parts specific gravity calculating unit 105 re-calculates a parts specific gravity 1010 between the independent part and the gravity source parts group and updates an item of a specific gravity 1010 in the class one parts specific gravity 2004.

Figure 6:
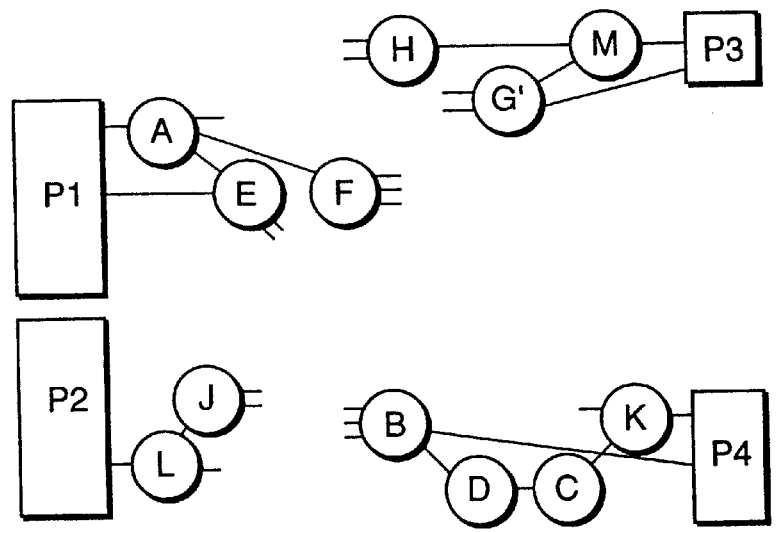

Then, the above process is repeated again to extract a combination which includes the independent part and the gravity source parts group and which has a maximum parts specific gravity 1010. As a result, each part is made to be included in a parts group which has a nucleus position designated part as shown in FIG. 6 (step S3).

Figure 7:
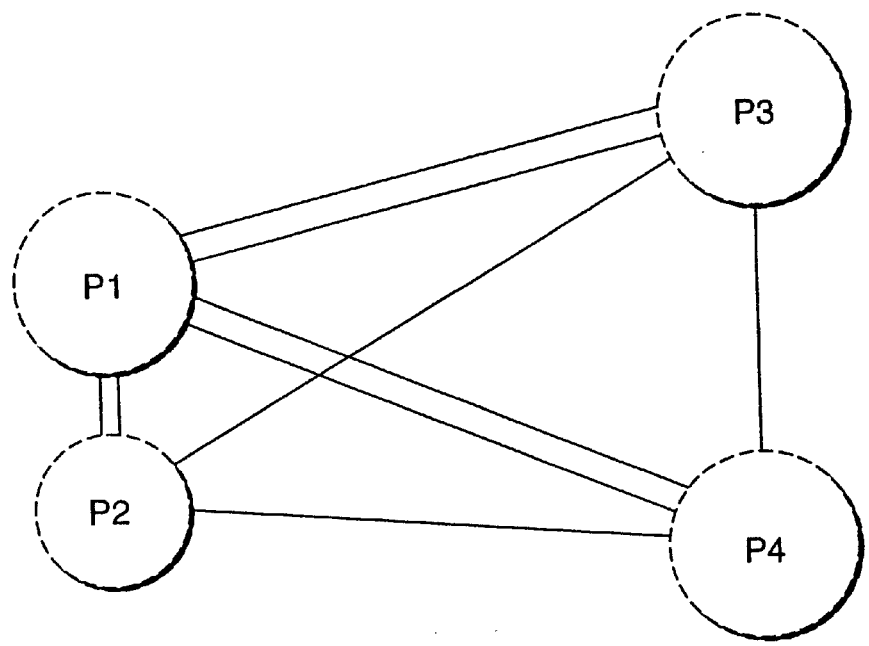

Next, in step S4, when a part included in the net aggregation data 2003 belongs to a plurality of parts groups, the re-distributing unit 107 registers or stores a parts name 1002 of the part in the form of a sequence of movable candidates. Thus extracted parts correspond to parts which are connected to nets between parts groups, as shown in FIG. 7.

Then, the re-distributing unit 107 extracts a parts name 1002 from the move candidate stack one after another and reads, from a first class parts specific gravity data 2004, parts specific gravity 1010 which corresponds to the parts name 1002 connected to each parts group. The parts are finally assigned to one of the parts groups that has a maximum specific gravity.

When the re-distributing unit 107 changes the parts groups from one to another, the unit 107 extracts a net aggregation data 2003 storing the part, and appends to the move candidate stack a parts name 1002 of a part which is stored in the extracted net aggregation data 2003 and which belongs to a parts group other than the target parts group of the part changed in group.

Figure 8:
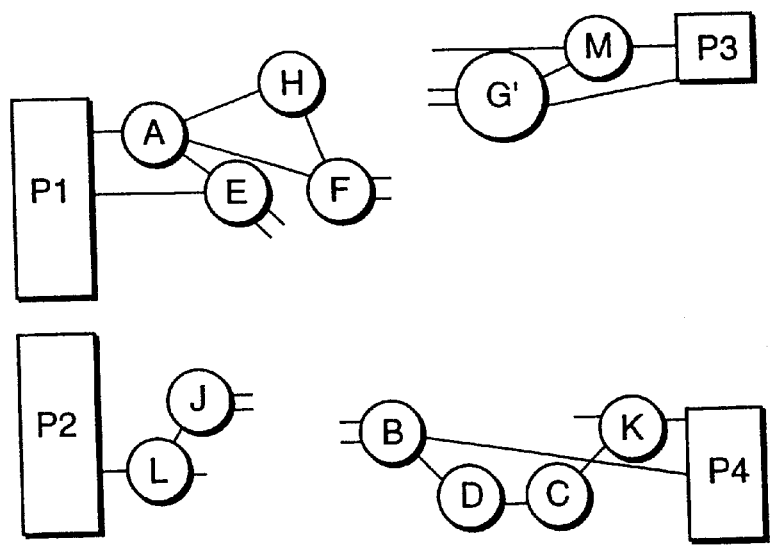

Further, the parts groups are changed as shown in FIG. 8 by repeating change process that changes parts which are connected between the parts groups. In consequence, each of the parts is assigned with either one of the parts groups (step S4).

Figure 9:
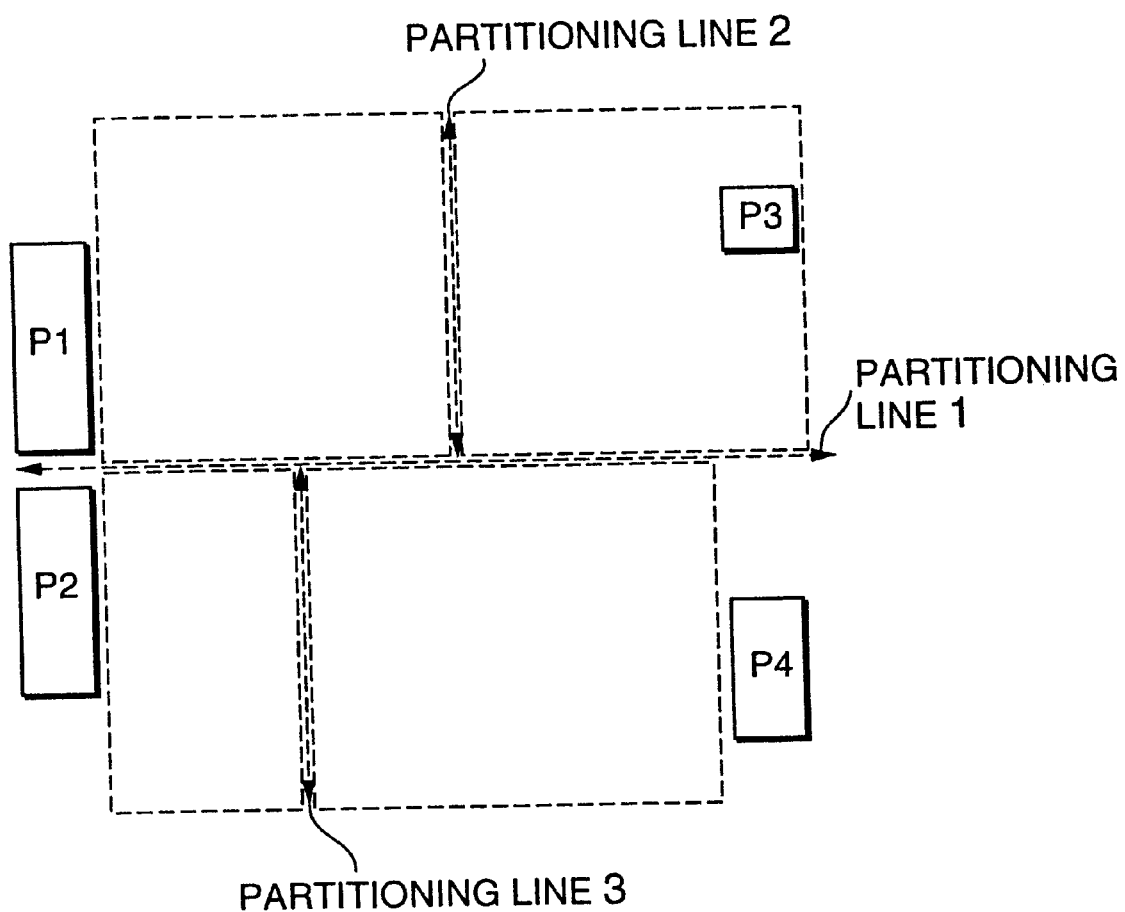

Next, in step S5, the partition producing unit 108 sums up the area of each part included in each parts group to obtain a total area for each parts group. Then, the unit 108 determines partitioning lines which partitions the parts placement zone according to a ratio of the above total area as shown in FIG. 9. Here, when the parts placement zone is defined as a placement zone of a part other than the position designated part, the above calculation is performed about a set of the parts other than the position designated part.

The partitioning line is drawn in the direction of the X-axis on two-dimensional plane defined by the X-Y coordinates to divide a parts placement zone into an upside and a downside. The partitioning line may be drawn in the direction of the Y-axis on the two-dimensional plane defined by the X-Y coordinates to divide a parts placement zone into a left side and a right side.

The zones divided by the partitioning lines may be referred to as "partitions" in this specification.

Furthermore, a new partitioning line which is perpendicular to the former produced partitioning line is produced to divide the partition into a upside and downside, or a left side and right side, until each partition is assigned to each parts group.

Thus, the parts placement zone is divided into a plurality of partitions for the respective parts groups. Further, for each partition a partition name 1011, coordinate values 1012 of boundary lines surrounding the partition, and partition data 2005 concerned with parts names 1002 are formulated as shown in FIG. 3B, and are stored in the parts placement process storage 110.

Here, as coordinate values 1012 of boundary lines, addresses storing coordinate values of the partitioning lines are stored. When the same partitioning line defines two boundary lines, the same address is stored as the coordinate values 1012 of the boundary lines (step S5).

Next, for each partitions, it is determined in step S6 whether or not the partition has a square shape, a rectangular shape which is longer widthwise than lengthwise (that is, the length along the X-axis is larger than the length along the Y-axis).

If the partition is square or rectangular in shape, step S7 (described later in more detail) is carried out. Briefly, parts placement positions are calculated at the step S7 from the left side to the right side along a first one-dimensional coordinate axis which descends rightwards at an angle of 45 degrees relative to the X-axis. Then, in step S8, parts placement positions are calculated from left side to right side along a second one-dimensional coordinate axis which ascends rightwards at an angle of 45 degrees relative to the X-axis. That is, both calculations of the parts placement position are carried out from the left side to the right side.

In step S9, the parts are placed on two-dimensional plane based on coordinate values obtained from both calculations.

On the other hand, let the partition have a shape longer in the Y-direction than in the X-direction. That is, when it is determined that the partition has a rectangle longer lengthwise than widthwise, parts placement positions are calculated in step S7 from upside to downside along a first one-dimensional coordinate axis which descends rightwards at an angle of 45 degrees relative to the X-axis. Then, in step S8, parts placement positions are calculated from upside to downside on a second first one-dimensional coordinate axis which ascends rightwards at an angle of 45 degrees relative to the X-axis. That is, both the calculations of the parts placement position are executed from upside to downside.

In step S9, the parts are placed on two-dimensional plane based on coordinate values obtained from both the calculations.

In step S7, the one-dimensional parts specific gravity calculating unit 112 calculates a specific gravity 1010 about parts included in a partition along the first one-dimensional coordinate axis which descends rightwards at an angle of 45 degrees relative to the X-axis. Further, the unit 112 produces a one-dimensional parts specific gravity 2006 including the calculated specific gravity 1010, along a parts name 1002, a partition name 1011, a direction of a one-dimensional coordinate axis 1013, and other items as shown in FIG. 3C, and stores the one-dimensional parts specific gravity 2006 into the parts placement process storage 110.

Then, the one-dimensional placing unit 111 carries out processing to calculate a total wiring length which is equal to a sum of lengths of nets for connecting parts on a printed wiring board.

Herein, it is to be noted that the total wiring length can be made to correspond to potential energy which is defined in connection with the physical phenomenon in the physics. In such a physical phenomenon, consideration may be made about placement of physical objects which brings about minimum potential energy and which may be called placement of minimum potential energy.

In this situation, the placement of the minimum potential energy can be made to correspond to minimize the total wiring length on the printed wiring board.

As known in the art, the placement of the minimum potential energy is given by successively placing the physical objects from a heaviest one to a lightest one.

This teaches that a minimized total wiring length can be accomplished by successively placing the parts from a heaviest one to a lightest one with respect to each of the position designated parts. In other words, the parts may be successively placed within each partition with respect to each position designated part from a part of the heaviest specific gravity to a part of the lightest specific gravity.

Taking the above into account, the unit 111 further determines a minimum total wiring length by placing the parts in a descending order of its parts specific gravity 1010.

The one-dimensional placing unit 111 calculates positions of each part along the first one-dimensional coordinate axis by the use of the following procedure, and produces the first one-dimensional parts placement data 2007 shown in FIG. 3D.

Further, the unit 111 stores a partition name 1011, a direction of one-dimensional coordinate axis 1013, a parts name 1002, and one-dimensional parts placement position 1015 of the part as a first one-dimensional parts placement data 2007. The first one-dimensional parts placement data 2007 is stored into the parts placement process storage 110.

At first, it is surmised that the parts are considered as a liquid filled in each partition and that gravity acts along the first one-dimensional coordinate of each partition.

Under the circumstances, the liquid which corresponds to the parts has a liquid surface inclined at an angle of 45 degrees at maximum. The liquid surface may be simulated by a division line which ascends rightwards with respect to the X-axis.

The unit 111 determines the division line which ascends rightwards at an angle of 45 degrees with respect to the X-axis and obtains another division line represented as $Y=X+Y0$, on the assumption that gravity is assumed to act in the direction of the first one-dimensional coordinate axis of the partition.

Herein, Y0 is a y-axis coordinate value of a point of intersection (intercept) of the Y-axis and the division line which divides a partition according to a ratio of the area of the parts.

A value of the Y0 is calculated and is included and stored in a first parts specific gravity data 2006 as a position coordinate 1014 of the division line, as shown in FIG. 3C.

Further, a position of the gravity point of a zone surrounded by the division line is calculated, to store, as a first parts placement position 1015, a y-axis intercept through which the line is extended in a right and upper direction at an angle of 45 degrees with respect to the X-axis and passes through on the gravity point.

Next, the one-dimensional parts specific gravity calculating unit 112 calculates a parts specific gravity 1010 using the following steps.

(1) Mapping the direction of nets for connection of the parts onto the first one-dimensional coordinate axis.

(2) Determining force of all connecting nets assuming that the force is proportional to the number of the nets and is directed to the one-dimensional coordinate axis.

(3) Dividing the force of all connecting nets by the areas of the parts to obtain the parts specific gravity 1010 of the first one-dimensional coordinate axis using the following equation (2).

After performing the steps, the parts specific gravity 1010 is stored in the one-dimensional parts specific gravity data 2006.

Each parts specific gravity 1010 of the parts along the first one-dimensional coordinate axis of the parts is given by:

$$([\text{the number of nets connected from a placement position of the part in the direction of the first one-dimensional coordinate axis}]-[\text{the number of nets connected in the reverse direction}])/[\text{an area of the part}] \quad (2)$$

In the calculation of the above equation (2), when there is a net connecting the part (the first part) to the other part (the second part), the direction of the net connected to the first part can be approximately calculated on the assumption that a position of the second part is placed at the center of a partition including the second part.

Further, the net aggregation data 2003 storing the first part are extracted during the calculation. As regards the other parts stored in the net aggregation data 2003, when there are a part which is located in the direction of the first one-dimensional coordinate axis and another part which is located in the reverse direction, the nets related to both the parts are cancelled on calculations.

The one-dimensional placing unit 111 then selects a part having a maximum parts specific gravity 1010 and places the part in the partition by filling. After that, the unit stores a parts name 1002 and a one-dimensional parts placement position 1015 in a first parts placement 2007 shown in FIG. 3D. Further, the unit 111 extracts net aggregation data 2003 storing the selected part and also extracts, in the net aggregation data 2003, the other parts that have not been placed yet.

The one-dimensional parts specific gravity calculating unit 112 calculates parts specific gravities 1010 of the extracted parts and updates the one-dimensional parts specific gravity data 2006 with the calculated parts specific gravities. The unit 112 then selects a part which has a next one of the maximum parts specific gravity 1010.

By repeating the above procedure, it is possible to obtain a parts placement of a minimum total wiring length on mapping onto the first one-dimensional coordinate axis.

Next, in step S8, the one-dimensional parts specific gravity calculating unit 112 calculates a parts specific gravity 1010 which is directed toward a second one-dimensional coordinate axis (the upper right to the X-axis) inclined at an angle of 45 degrees relative to the X-axis, similarly to step S7. Further, the one-dimensional placing unit 111 calculates a position of the part on the second one-dimensional coordinate axis and stores the position as a portion of the second one-dimensional parts placement data 2007.

Figure 11A:
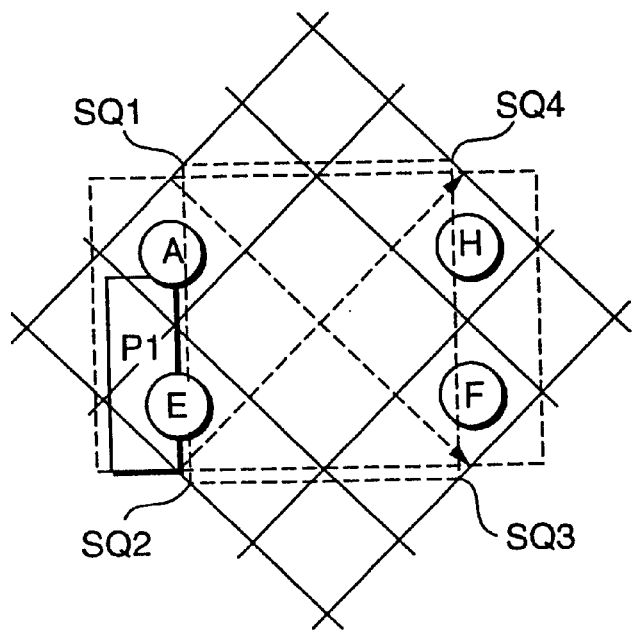
Figure 11B:
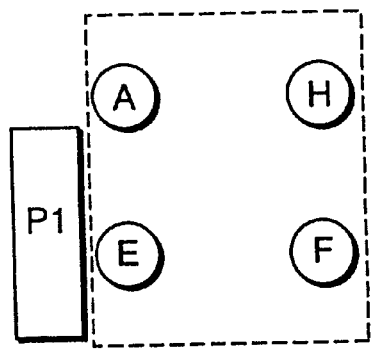

Next, in step S9, the two-dimensional parts placing unit 113 two-dimensionally places the part with reference to coordinate values of the first one-dimensional parts placement 2007 along the coordinate axis which descends rightwards at an angle of 45 degrees relative to the X-axis, and a coordinate values of the second on-dimensional parts placement 2007 on the coordinate axis which ascends rightwards at an angle of 45 degrees relative to the X-axis as shown in FIG. 11B.

Then, in step S10, the layout mapping unit 114 positions in a partition a set of parts (parts group) two-dimensionally placed in step S9, by using two methods.

A first method includes the following steps.
(1) Creating a restriction graph which records a limit of moving of parts or boundary lines of the partition in the direction of Y-axis by performing one-dimensional compaction process in the direction of Y-axis.
(2) Calculating the Y-axis lower limit of a position of parts moving to the bottom end of the partition by calculating the shortest path of the restriction graph.
(3) Calculating the Y-axis lower limit of positions of parts moving to the downside as far as collision between the parts does not occur.
(4) Calculating the Y-axis upper limit of a position of parts moving to the upside until the parts arrive at the upper end of the partition.
(5) Positioning the parts in between the Y-axis lower limit and the Y-axis upper limit of the partition.
(6) Steps similar to steps (1) to (5) are performed about X-axis, that is, calculating the leftmost limit of the part and the rightmost limit of the part by the X-axis one-dimensional compaction process, and positioning the parts between the X-axis leftmost limit and the X-axis rightmost limit of the position.

The first method may place a parts group in a partition by using two-dimensional compaction process rather than the above one-dimensional compaction process.

Figure 13A:
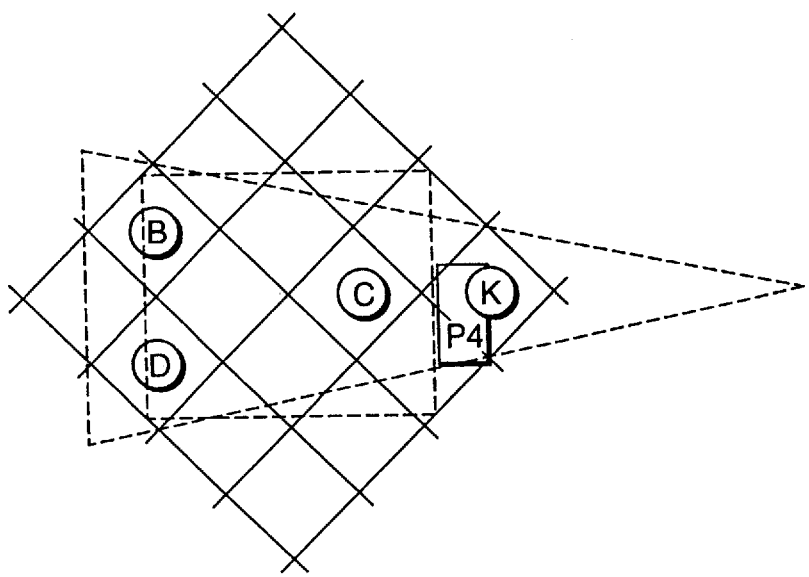
Figure 13B:
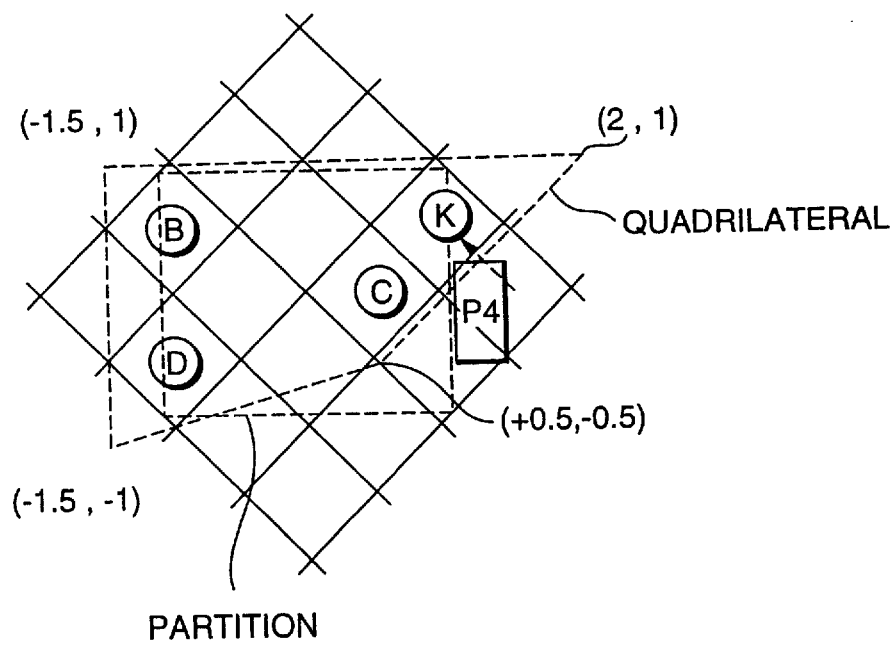
Figure 14:
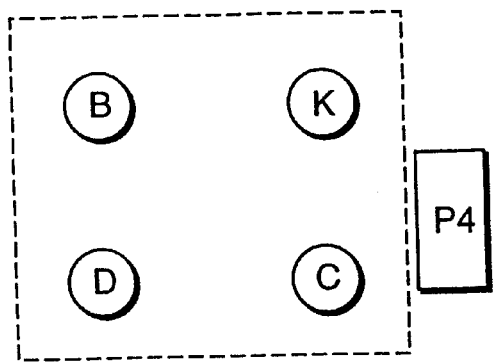

On the other hand, the second method of positioning a parts group in a partition calculates any shapes of quadrilateral including a set of parts (parts group) two-dimensional placed in step S9. In this case, when there are four parts and there are three parts contacting with a shape surrounding the parts group as shown in FIG. 13A, parts contacting with both of the upper side and the lower side of the quadrilateral or parts contacting with both of the left side and the right side of the quadrilateral are extracted, and quadrilateral contacting with more three parts in the parts group is produced by moving the extracted part (for example, the part K in FIG. 13A) as shown in FIG. 13B.

The layout mapping unit 114 performs coordinate transform process which maps the produced quadrilateral to a rectangular in the partition and calculates the mapped parts placement position.

The coordinate transform process is given by equations (3) and (4). That is, when the quadrilateral has the left lower vertex (X0, Y0), the right lower vertex (X1, Y1), the right upper vertex (X2, Y2), and the left upper vertex (X3, Y3), and the rectangular has the left lower vertex (Xs, Ys) and the right upper vertex (Xe, Ye), parts placement position coordinates (X, Y) on the quadrilateral are mapped to parts position coordinates (Xn, Yn) in the partition by using the equations (3) and (4) as shown in FIGS. 11A and 11B (step 10).

$$Xn=K*(A*(X-X0)*(Y-Y3)-B*(Y-Y0)*(X-X3))+Xs \qquad (3)$$

$$Yn=L*(C*(X-X0)*(Y-Y1)-D*(Y-Y0)*(X-X1))+Ys \qquad (4)$$

Herein, the above parameters A, B, C, D, K, and L are each represented by the following equations 4a through 4g.

$$A=(Y1-Y0)*(X1-X3)-(Y2-Y0)*(X2-X3) \qquad (4a)$$

$$B=(X1-X0)*(Y1-Y3)-(X2-X0)*(Y2-Y3) \qquad (4b)$$

$$C=(Y3-Y0)*(X3-X1)-(Y2-Y0)*(X2-X1) \qquad (4c)$$

$$D=(X3-X0)*(Y3-Y1)-(X2-X0)*(Y2-Y1) \qquad (4d)$$

$$K=(Xe-Xs)/\{A*(X2-X0)*(Y2-Y3)-B*(Y2-Y0)*(X2-X3)\} \qquad (4f)$$

$$L=(Ye-Ys)/\{C*(X2-X0)*(Y2-Y1)-D*(Y2-Y0)*(X2-X1)\} \qquad (4g)$$

When steps S7 to S10 are completed, process returns to step S6, these steps are repeated for each partition until all the partitions are processed. Then, process proceeds to step S11.

Figure 16:
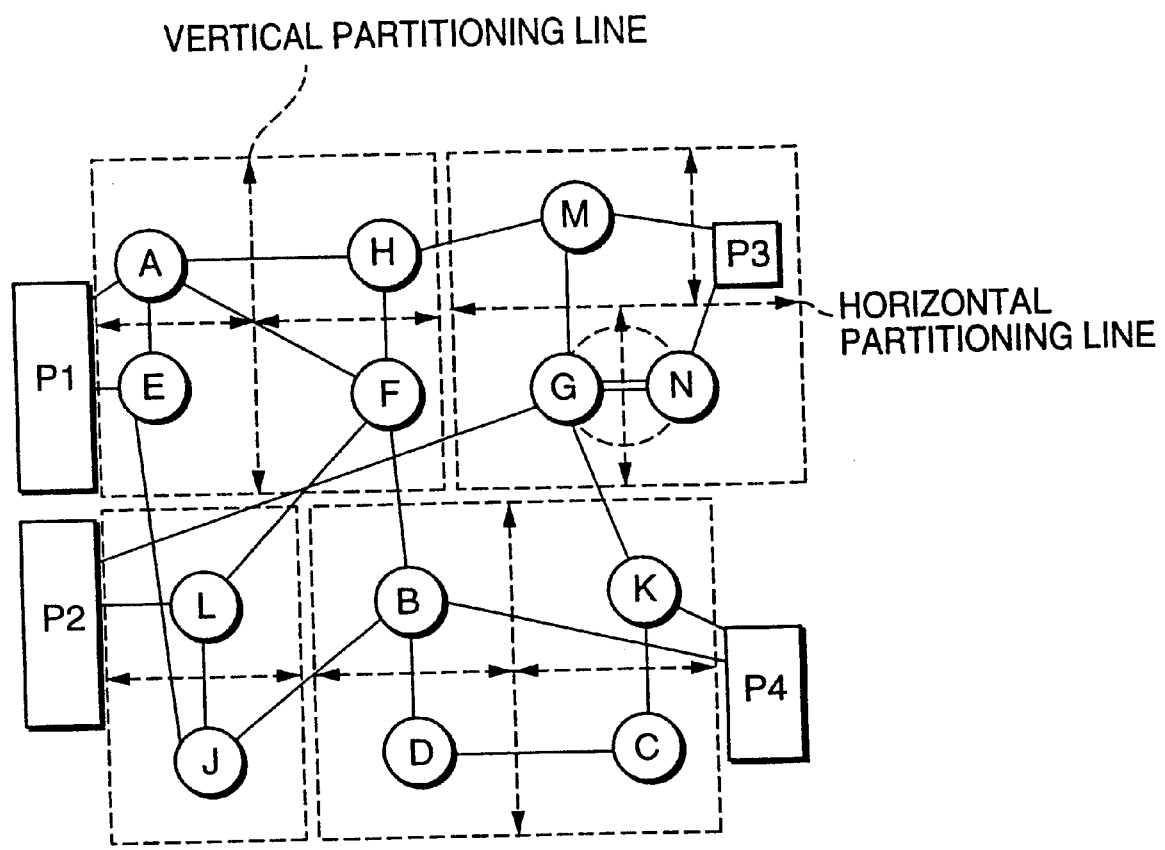
Figure 17:
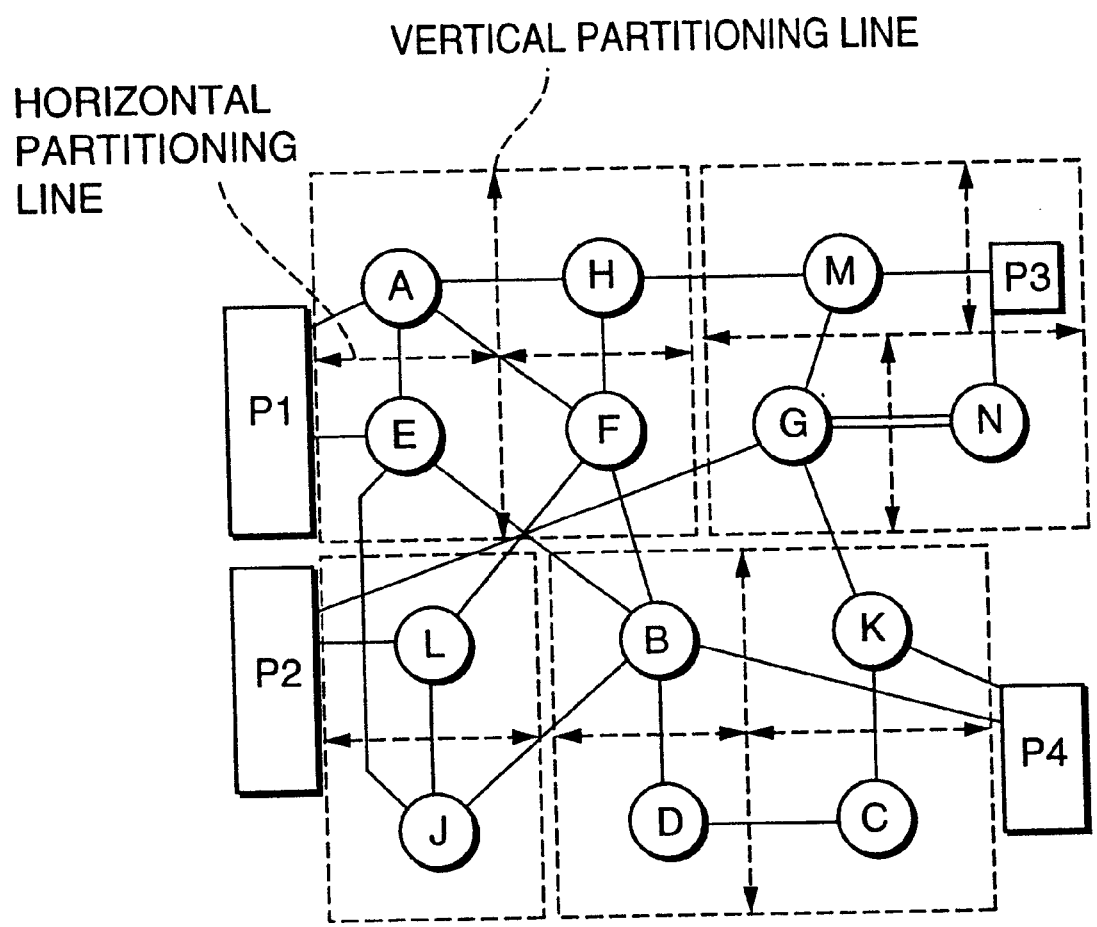

Next, in step S11, the partition dividing unit 115 divides a partition into a plurality of zones according to an area of the parts group by producing vertical partitioning lines to divide parts groups placed in the partition into the left side and the right side and by producing horizontal partitioning lines to divide parts groups placed in the partition into the upper side and the lower side as shown in FIG. 16.

The one-dimensional parts specific gravity calculating unit 112 calculates parts specific gravities 1010 of parts and positions the parts in a partition in order of the parts specific gravity 1010.

Lastly, the unit 112 places the parts in the center of the corresponding partition (step S11). This process of step S11 may be performed for each partition to which the part is positioned by calculating the upper side limit position, the lower side limit position, the left side limit position, and the right side limit position of placing the part with compaction process and by placing the part in the center of the zone defined the above limit positions.

Referring to FIGS. 5 through 17, description will be made about the method according to one embodiment of the invention in more detail.

In FIG. 5, parts and nets are placed on the printed wiring board to which the invention is applied.

Like in the step S1 of FIG. 4, a plurality of position designated parts P1, P2, P3, P4, and parts A through N are illustrated in FIG. 5 and are given to the parts data input unit 101 as parts data 2002, as shown in FIG. 5.

In response to instructions of an operator, the input unit 103 places the position designated parts P1 through P4, extracts parts placement position coordinate values 1007 of the parts as the parts data 2002, and stores the parts data 2002 into the parts data storage 102.

Further, supplied with net data 2001 for connection among terminals of the parts, the parts data input unit 101 stores the net data 2001 to the parts data storage 102.

In FIG. 5, the net data 2001 is representative of a plurality of line segments. Herein, it is assumed that the zone of each parts, A through N, is equal to unity.

Next, in step S2 in FIG. 4, the cluster producing unit 104 calculates the number of nets connecting the parts. In this embodiment, the parts G and N have two common nets while the common nets of the part N are smaller by one in number than the other net connected to the other part or parts.

The parts data 2002 are produced such that the parts area becomes equal to "2" and is specified by a summed area of the parts G and N, since the common nets between the parts G and N is greater in number than the net between the part N and the other part. This set or combination of the parts is referred to as "cluster G'" and will be handled as part G' also.

Then, as described in conjunction with the step S3 of FIG. 4, the first parts specific gravity calculating unit 105 calculates a parts specific gravity 1010 by using the equation (1) for each set of two parts in the parts group. Further, the parts group producing unit 106 adds the parts to the parts group including a position designated part as a nucleus. Such addition is made in the order from a heaviest one to a lightest one of the parts specific gravity, as shown in FIG. 6.

The first parts specific gravity calculating unit 105 at first calculates in a manner to be described below.

Parts specific gravities 1010 of the parts A and E attracted by the position designated part P1 are each determined by using the equation (1).

Part A: −2

Part E: −2

Further, parts specific gravities 1010 of the parts G' and L attracted by the position designated part P2 are each determined using the equation (1).

Part G': −1

Part L: −1

Further, parts specific gravities 1010 of the parts G' and M attracted by the position designated part P3 are each determined using the equation (1).

Part G': −1

Part M: −1

Further, parts specific gravities 1010 of the parts B and K attracted by the position designated part P4 are each determined using the equation (1).

Part B: −3

Part K: −1

Next, the parts group producing unit 106 extracts a set of parts having the maximum parts specific gravity 1010.

In this example, the set of parts having the maximum parts specific gravity 1010 are the parts G' and L (attracted by the part P2), the parts G' and M (attracted by the part P3), and the part K (attracted by the part P4).

There is a degree of freedom about selection among a set of parts each of which has the same maximum parts specific gravity 1010. But, in this example, at first, the part L attracted by the part P2 is selected as a part having the maximum parts specific gravity and is added to a parts group having a nucleus part P2 (referred to as "P2 parts group").

As a result, it is determined that independent parts (which is not yet added to a parts group) which cause the parts specific gravity 1010 to change are the parts F and J each of which is connected to the part L included in the P2 parts group. The parts specific gravities 1010 of the parts F and J are given in connection with the part P2 as follows.

Part F: −2

Part J: −1

Next, the part M attracted by a parts group having a nuclear part P3 (referred to as "P3 parts group") is selected as a part having the maximum parts specific gravity and is added to the P3 parts group.

As a result, it is determined that independent parts which cause the parts specific gravity 1010 to change are the parts G' and H each of which is connected to the part M. The parts specific gravities 1010 of the parts G' and H are as follows.

Part G': 0

Part H: −1

In this case, the part G' is added to the P3 parts group, since the parts specific gravity 1010 of the part G' is equal to zero and is therefore the maximum value. As a result, it is determined that independent part which causes the parts specific gravity 1010 to change is the part K which is connected to the part G. The parts specific gravity 1010 of the part K is −1.

Next, the part K attracted by a P4 parts group is selected as a part having the maximum parts specific gravity and is added to the P4 parts group.

As a result, it is determined that independent part which causes the parts specific gravity 1010 to change is the part C which is connected to the part K. The parts specific gravities 1010 of the part C is zero (0).

In this case, the part C is added to the P4 parts group, since the parts specific gravity 1010 of the part C is equal to zero and is therefore the maximum value. This results in a change of the specific gravity in the part D connected to the part C. Practically, the parts specific gravity 1010 of the part D is 0.

Next, the part D is added to the P4 parts group, since the parts specific gravity 1010 of the part D is equal to zero and is therefore the maximum value.

As a result, it is determined that independent part which causes the parts specific gravity 1010 to change is the part B which is connected to the part D. The parts specific gravity 1010 of the part B is −1.

Next, the part A attracted by the P1 parts group is selected as a part having the maximum parts specific gravity and is added to the P1 parts group.

As a result, it is determined that independent parts which cause the parts specific gravity 1010 to change are the parts E and H each of which is connected to the part A. The parts specific gravities 1010 of the parts E and H is as follows.

Part E: 0

Part H: −1

In this case, the part E is added to the P1 parts group, since the parts specific gravity 1010 of the part E is equal to zero and is therefore the maximum value. As a result, it is determined that independent part which causes the parts specific gravity 1010 to change is the part B which is connected to the part E. The parts specific gravity 1010 of the part B is −3.

Next, the part J attracted by the P2 parts group is selected as a part having the maximum parts specific gravity and is added to the P2 parts group.

As a result, it is determined that independent part which causes the parts specific gravity 1010 to change is the part B which is connected to the part J. The parts specific gravities 1010 of the part B is −3.

Next, the part B attracted by the P4 parts group is selected as a part having the maximum parts specific gravity and is added to the P4 parts group.

As a result, it is determined that independent part which causes the parts specific gravity 1010 to change is the part F which is connected to the part B. The parts specific gravities 1010 of the part F is −2.

Next, the part H attracted by the P3 parts group is selected as a part having the maximum parts specific gravity and is added to the P3 parts group.

As a result, it is determined that independent part which causes the parts specific gravity 1010 to change is the part F which is connected to the part H. The parts specific gravities 1010 of the part F is −2.

Finally, the part F attracted by the P1 parts group is added to the P1 parts group and a series of processes is completed. As a result, parts groups are produced as shown in FIG. 6.

Next, in the step S4 of FIG. 4, the re-distributing unit 107 extracts parts each of which is an element of the net aggregation data 2003 and belongs to a plurality of parts groups, F, L, E, J, A, H, B, G, and K, and stores the parts names 1002 of the extracted parts to the move candidate stack.

The re-distributing unit 107 then selects the part F from the move candidate stack, and calculates the parts specific gravity 1010 of the part F for connections to each parts group, using the above equation (1).

Consequently, it is found that the parts specific gravities of the part F are all −3 for each connection (to the part A in the P1 parts group, to the part L in the P2 parts group, to the part H in the P3 parts group, and to the part B in the P4 parts group). Therefore, the part F is still made to belong to the P1 parts group and the processed part F is removed from the move candidate stack.

Then, the part L is selected from the move candidate stack. Since the part L currently belongs to the P2 parts group and the part J, decision is eventually made about the fact that the part L is connected to the P2 parts group with the maximum parts specific gravity 1010. Therefore, the part L is assigned to the P2 parts group without any change.

Similarly, the parts E, J and A are also kept unchanged in the parts groups.

Next, the part H illustrated in FIG. 5 is selected which is connected to the parts A, F, and M. Then, it is determined that the part H is connected to the parts A and F which both belong to the P1 parts group. The part H has the maximum specific gravity in connection with the P1 parts group.

Therefore, the part H is moved from the P3 parts group to the P1 parts group. Then, it is determined that the part H is connected to part M which belongs to P3 parts group (that is, other than the P1 parts group), and the part M is added to a list in the move candidate stack. Consequently, there are the parts B, G', K, and M in the move candidate stack.

The parts B, G', K, and M are not moved to configure elements in the parts groups as shown in FIG. 8.

Next, in the step S5 of FIG. 4, the partition producing unit 108 produces partitioning lines on the placement zone to define boundaries, as shown in FIG. 9. Horizontal partitioning line 1 divides the zone into a first set of the P1 parts group and the P3 parts group, and a second set of the P2 parts group and the P4 parts group based on a ratio of an area of the set.

Further, vertical partitioning line 2 divides the first set into the P1 parts group and the P3 parts group. Vertical partitioning line 3 divides the second set into the P2 parts group and the P4 parts group based on a ratio of an area of the parts group.

Next, in the step S6 of FIG. 4, an area of the partition of the P1 parts group on the upper left in the XY coordinate two-dimensional plane of a substrate is distributed according to a ratio of an area related to the parts A, E, F, and H. Thus each determined area is defined as the corresponding parts occupied area.

Then, for each partition including parts groups, the following steps S7 through S10 are executed.

Figure 10A:
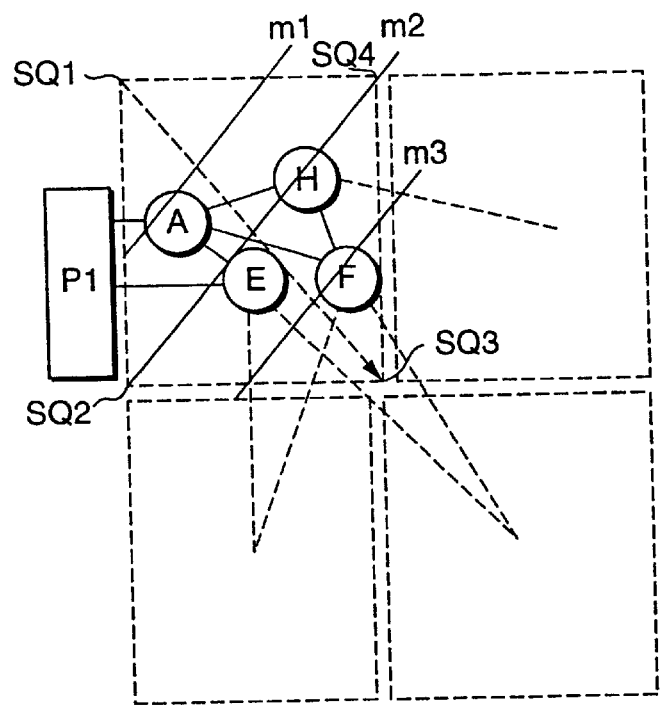

As shown in FIG. 10A, a shape of partition of P1 parts group is square (the corner points are depicted by SQ1, SQ2, SQ3, and SQ4). In this case, from the left side of the partition to the right side, parts placement positions are calculated.

Next, in step S7 in FIG. 4, the parts A, E, F, and H are placed on a one-dimensional coordinate axis (a first one-dimensional coordinate axis) which links the upper left point SQ1 and the lower right point SQ3 shown in FIG. 10A with a straight line which descends rightwards at an angle of 45 degrees relative to the top side of the partition. The placement of the parts A, E, F, and H is performed in the following procedure.

At first, the one-dimensional parts specific gravity calculating unit 112 calculates a Y-axis intercept of a division line m1 so that a zone surrounded by a part of the top side of the partition and a part of the left side of the partition each of which includes the point SQ1 and the division line m1 which descends leftwards at an angle of 45 degrees relative to the top side of the partition is equal to a part occupied area. And the unit 112 stores the Y-axis intercept of the division line m1 into the one-dimensional parts specific gravity data 2006 as a division line position coordinate 1014.

Further, the gravity point of the surrounded zone is determined together with y coordinate value (Y-axis intercept) from the gravity point. The y coordinate value can be calculated from the Y-axis and a straight line (a first straight line) which extends parallel to the division line m1 from the gravity point intersects. Then, the determined y coordinate value is stored into the one-dimensional parts specific gravity data 2006 as a one-dimensional parts placement position 1015.

After that, parts specific gravities 1010 on the first one-dimensional coordinate axis are calculated (force attracted toward the upper left is defined as positive one) by using the above equation (2). In this calculation, attracting force (+1) which attracts in the direction of the upper left on the first one-dimensional coordinate axis is given from parts which reside above the first straight line. On the other hand, from parts which reside beneath the first straight line, repulsive force is given.

Positions of parts in the other partitions are calculated assuming that each of the parts resides in the center of the corresponding partition.

Calculating parts specific gravities 1010 of undefined parts, the following results are obtained.

Part A: −2
Part E: −2
Part H: −3
Part F: −4

As a result, parts having the maximum parts specific gravity 1010 are parts A and E.

The one-dimensional placing unit 111 selects the part A and positions the part A in a zone between the point SQ1 and the division line m1 related to the part A. The placement of the part A is stored in the first one-dimensional parts placement data 2007.

Next, the one-dimensional placing unit 111 calculates position of a second division line m2, for each undefined part, so that a zone which is a part of the partition and is defined by the division line m1 corresponding to the former part and the second division line m2 parallel to the line m1 is equal to a second part occupied area. The calculated second division line m2 is stored into the one-dimensional parts specific gravity data 2006.

Then, the one-dimensional parts specific gravity calculating unit 112 calculates parts specific gravities 1010 by dividing attracting force which attracts each part in the direction of the upper left on the first one-dimensional coordinate axis by an area of the second part. The determined parts specific gravities 1010 are as follows.

Part E: 0

Part H: −1

Part F: −2

Therefore, the part E has the maximum parts specific gravity 1010. The one-dimensional placing unit 111 positions the part E in a zone between the first division line m1 and the second division line m2, and the placement of the part E is stored in the first one-dimensional parts placement data 2007.

Similarly, parts specific gravities 1010 are calculated about the remaining parts and the results are shown as follows.

Part H: −1

Part F: −2

Therefore, the part H has the maximum parts specific gravity 1010. The one-dimensional placing unit 111 calculates position of a third division line m3 and positions the part H in a zone between the second division line m2 and the third division line m3. The placement of the part H is stored in the first one-dimensional parts placement data 2007.

Lastly, the part F is added to a zone between the third division line m3 and the point SQ3 and the placement of the part F is stored in the first one-dimensional parts placement data 2007.

Thus, the parts are placed on the first one-dimensional coordinate axis from the upper left in the order of A, E, H, and F. The order of parts names 1002 and a one-dimensional parts placement position 1015 are stored into the first one-dimensional parts placement data 2007.

Figure 10B:
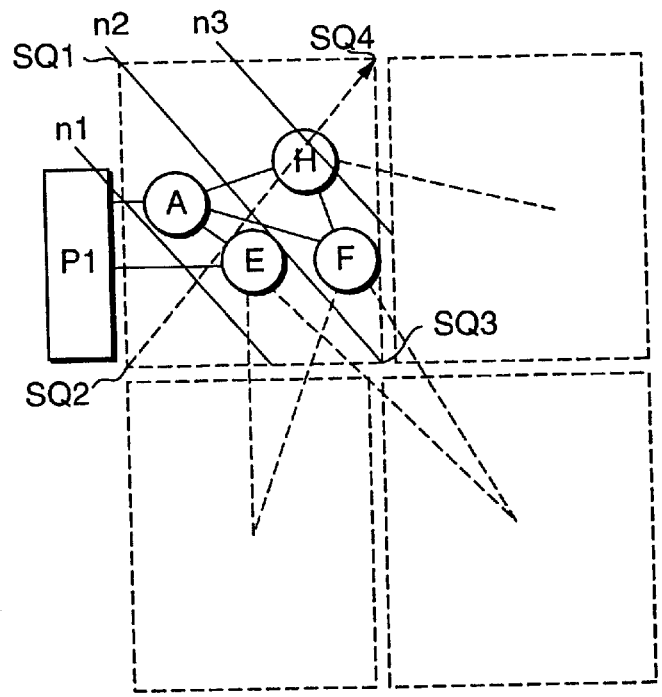

Next, in step S8 in FIG. 4, the one-dimensional placing unit 111 places the parts A, E, F, and H on a one-dimensional coordinate axis (a second one-dimensional coordinate axis) which links the upper right point SQ4 and the lower left point SQ2 shown in FIG. 10B with a straight line which ascends rightwards at an angle of 45 degrees relative to the bottom side of the partition. The placement of the parts A, E, F, and H is performed in the following procedure.

The one-dimensional placing unit 111 calculates, for each part (A, E, F, and H), a Y-axis intercept of a division line n1 so that a zone surrounded by a part of the bottom side of the partition and a part of the left side of the partition each of which includes the point SQ2 and the division line n1 which descends rightwards at an angle of 45 degrees relative to the bottom side of the partition is equal to a part occupied area. And the unit 111 stores the Y-axis intercept of the division line n1 into the one-dimensional parts specific gravity data 2006 as a division line position coordinate 1014.

Further, the gravity point of the surrounded zone is determined together with y coordinate value (Y-axis intercept) from the gravity point. The y coordinate value can be calculated from the Y-axis and a straight line (a second straight line) which extends parallel to the division line n1 from the gravity point intersects. Then, the determined y coordinate value is stored into the one-dimensional parts specific gravity data 2006 as a one-dimensional parts placement position 1015.

After that, the one-dimensional parts specific gravity calculating unit 112 calculates parts specific gravities 1010 on the second one-dimensional coordinate axis (force attracted toward the lower left is defined as positive one) using the above equation (2). In this calculation, attracting force (+1) which attracts in the direction of the lower left on the second one-dimensional coordinate axis is given from parts which reside beneath the second straight line. On the other hand, from parts which reside above the second straight line, repulsive force is given.

When the one-dimensional parts specific gravity calculating unit 112 calculates parts specific gravities 1010 of undefined parts, the following results are obtained.

Part A: −2

Part E: 0

Part H: −3

Part F: −2

As a result, part having the maximum parts specific gravity 1010 is the part E. Then, the one-dimensional placing unit 111 selects the part E and positions the part E in a zone between the point SQ2 and the division line n1. The placement of the part E is stored in the second one-dimensional parts placement data 2007.

Next, the next part is positioned in a zone between the first division line n1 and a second division line n2 which is parallel to the division line n1 and the parts specific gravity 1010 is calculated. And the results are obtained as follows.

Part A: 0

Part H: −1

Part F: −2

Therefore, the part A has the maximum parts specific gravity 1010. The one-dimensional placing unit 111 positions the part A in a zone between the first division line n1 and the second division line n2 and the placement of the part A is stored in the second one-dimensional parts placement data 2007.

Similarly, parts specific gravities 1010 are calculated about the remaining parts and the results are shown as follows.

Part H: −1

Part F: 0

Therefore, the part F has the maximum parts specific gravity 1010. The one-dimensional placing unit 111 calculates position of a third division line n3 and positions the part F in a zone between the second division line n2 and the third division line n3. The placement of the part F is stored in the second one-dimensional parts placement data 2007.

Lastly, the part H is added to a zone between the third division line n3 and the point SQ4 and the placement of the part H is stored in the second one-dimensional parts placement data 2007.

Thus, the parts are placed on the second one-dimensional coordinate axis from the lower left in the order of E, A, F, and H. The order of parts names 1002 and a one-dimensional parts placement position 1015 are stored into the second one-dimensional parts placement data 2007.

Next, in step S9 in FIG. 4, the two-dimensional parts placing unit 113 uses the first one-dimensional parts placement position 1015 on the first one-dimensional coordinate axis and the second one-dimensional parts placement position 1015 on the second one-dimensional coordinate axis to place the parts on the XY coordinate two-dimensional plane as shown in FIG. 11A.

Then, in step S10 in FIG. 4, the layout mapping unit 114 calculates a quadrilateral including the placed parts group as follows. After that, coordinates of the quadrilateral is transformed or mapped onto the partition and parts placement positions are each calculated according to the mapping as shown in FIG. 11B.

The mapping is realized using the above equations (3) and (4). That is, assuming that sets of coordinate values of vertexes of the quadrilateral are (−1.5, −1 (the lower left corner)), (1.5, −1 (the lower right corner)), (1.5, 1 (the upper right corner)), and (−1.5, 1 (the upper left corner)), a set of coordinate values of the lower left corner SQ2 of the partition is (−1, −1), and a set of coordinate values of the upper right corner SQ4 of the partition is (1, 1), the equations (3) and (4) are calculated. As a result, the following position is obtained.

$$Xn=2*(X+1.5)/3-1 \quad Yn=Y \tag{5}$$

By using the equation (5), sets of coordinate values (X, Y) of the parts A, E, F, and H shown in FIG. 11A are each transformed to a set of coordinate values (Xn, Yn) shown in FIG. 11B.

Next, returning back to the step S6 in FIG. 4, a partition including the P2 parts group is processed. In step S6, it is determined that a shape of the partition is a quadrilateral with more depth than frontage (that is, the length along Y-axis is larger than the length along X-axis). In this case, calculation is performed about the second one-dimensional parts placement in the order from the upper right to the lower left (arrow 2) after calculation of the first one-dimensional parts placement in the order from the upper left to the lower right (arrow 1).

That is, calculations about the first one-dimensional parts placement and the second one-dimensional parts placement are both performed in the order from the upside to the downside.

Figure 12A:
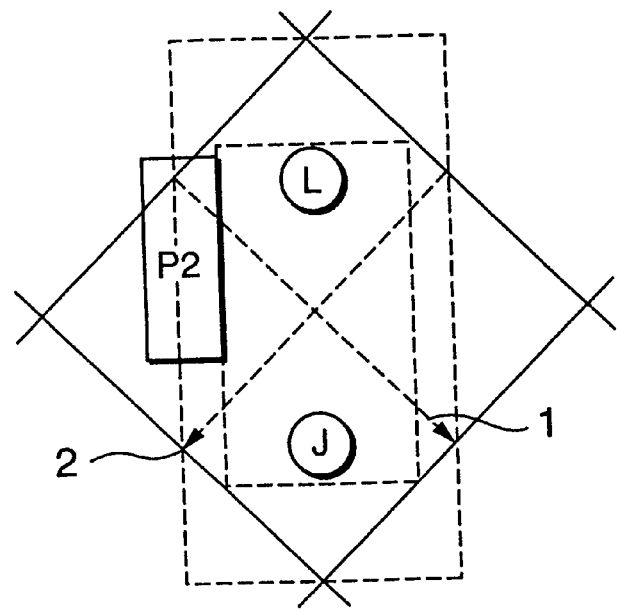
Figure 12B:
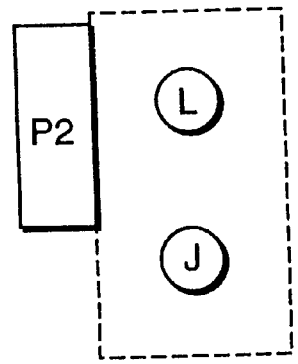

Process is performed in a manner similar to the P1 parts group, and placement including the part L in upside and the part J in downside is given. Another placement shown in FIG. 12B is given by mapping the placement shown in FIG. 12A to the partition.

Next, returning step S6, process is performed about a partition including the P4 parts group.

When the process about P4 parts group proceeds to step S9 in FIG. 4, two-dimensional parts placement shown in FIG. 13A is given.

Then, in step S10, a quadrilateral including the parts group is produced. In the illustrated example shown in FIG. 13A, only three parts (regions related to the parts) contact with a triangle including all the parts B, C, D, and K among the four parts while the part K contacts with both sides of the triangle. Herein, the part K is moved so that a net length become shorter as shown in FIG. 13B.

That is, a parts specific gravity 1010 (downward force is defined as positive one) of the moved part K is calculated and −1 is determined as its value. When the parts specific gravity 1010 is smaller than zero, the part K is moved to upside partitioned zone as shown in FIG. 13B. By the movement of the part K, the quadrilateral includes the four parts including the part K.

When sets of coordinates of the vertexes of the quadrilateral are (−1.5, −1 (the lower left corner)), (0.5, −0.5 (the lower right corner)), (2, 1 (the upper right corner)), and (−1.5, 1 (the upper left corner)) and sets of coordinates of the vertexes of the partition are (−1, −1 (the lower left corner)) and (1, 1 (the upper right corner)), the following mapping equation (6) is determined using the equations (3) and (4).

$$Xn=2*(X+1.5)*(Y-3)/7-1 \quad Yn=\{4(X+1.5)*(Y+0.5)-3(X-0.5)*(Y+1)\}/6-1 \tag{6}$$

Then, the quadrilateral is mapped to the partition of the P4 parts group and positions of the parts are transformed. As a result, positions of parts placed in the partition are determined.

Figure 15:
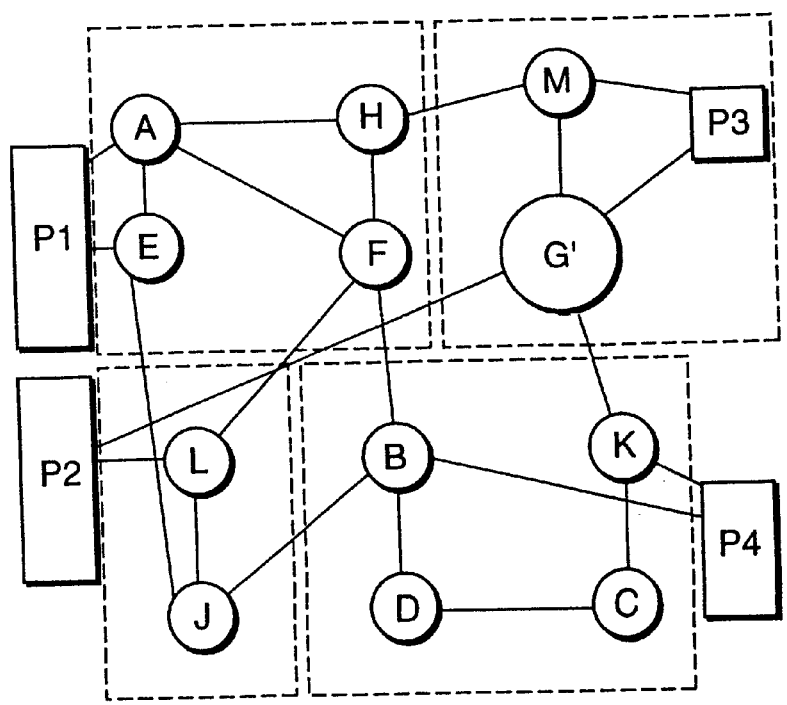

Next, returning to step S6, the similar process is performed about the partition of the P3 parts group and consecutively, a parts placement is produced as shown in FIG. 15.

Thus, after processing is finished about all the partitions, the process proceeds to step S11, and then, the partition dividing unit 115 determines a plurality of partitioning lines which divide a partition into a plurality of zones according to a ratio of an area of the part, for each partition, as shown in FIG. 16.

Specifically, for the P1 parts group, the unit 115 determines a partitioning line which divides the partition into the left side zone including the parts A and E, and the right side zone including the parts H and F. Furthermore, the unit 115 determines other partitioning lines. One divides the left side zone into a zone of the part A and a zone of the part E vertically. The other divides the right side zone into a zone of the part H and a zone of the part F vertically.

For P2 parts group, although a shape of the partition is a rectangular with more depth than frontage, in this case, a horizontal partitioning line is produced which divides the partition into a zone of the part L and a zone of the part J vertically.

For P3 parts group, a horizontal partitioning line is produced which divides the partition into a zone of the parts M and P3, and a zone of the part G' vertically.

For P4 parts group, although a shape of the partition is a rectangular with more frontage than depth, in this case, a vertical partitioning line is firstly produced which divides the partition into a zone of the parts B and D, and a zone of the parts C and K horizontally. Then, a horizontal partitioning line which divides the partition into a zone of the part B and a zone of the part D vertically, and a horizontal partitioning line which divides the partition into a zone of the part K and a zone of the part C vertically are produced.

Further, the unit 115 produces a vertical partitioning line which divides the partition including cluster G' into two zones according to a ratio of an area of the cluster G' and the part N horizontally.

Next, parts specific gravities 1010 attracted to the left side of the cluster G' and the part N are determined as follows.

Part G: −1

Part N: −3

Then, the part G is placed in the left side zone of the above divided two zones and the part N is placed in the right side zone.

The unit 115 places each part in the center of the corresponding zone.

Figure 18:
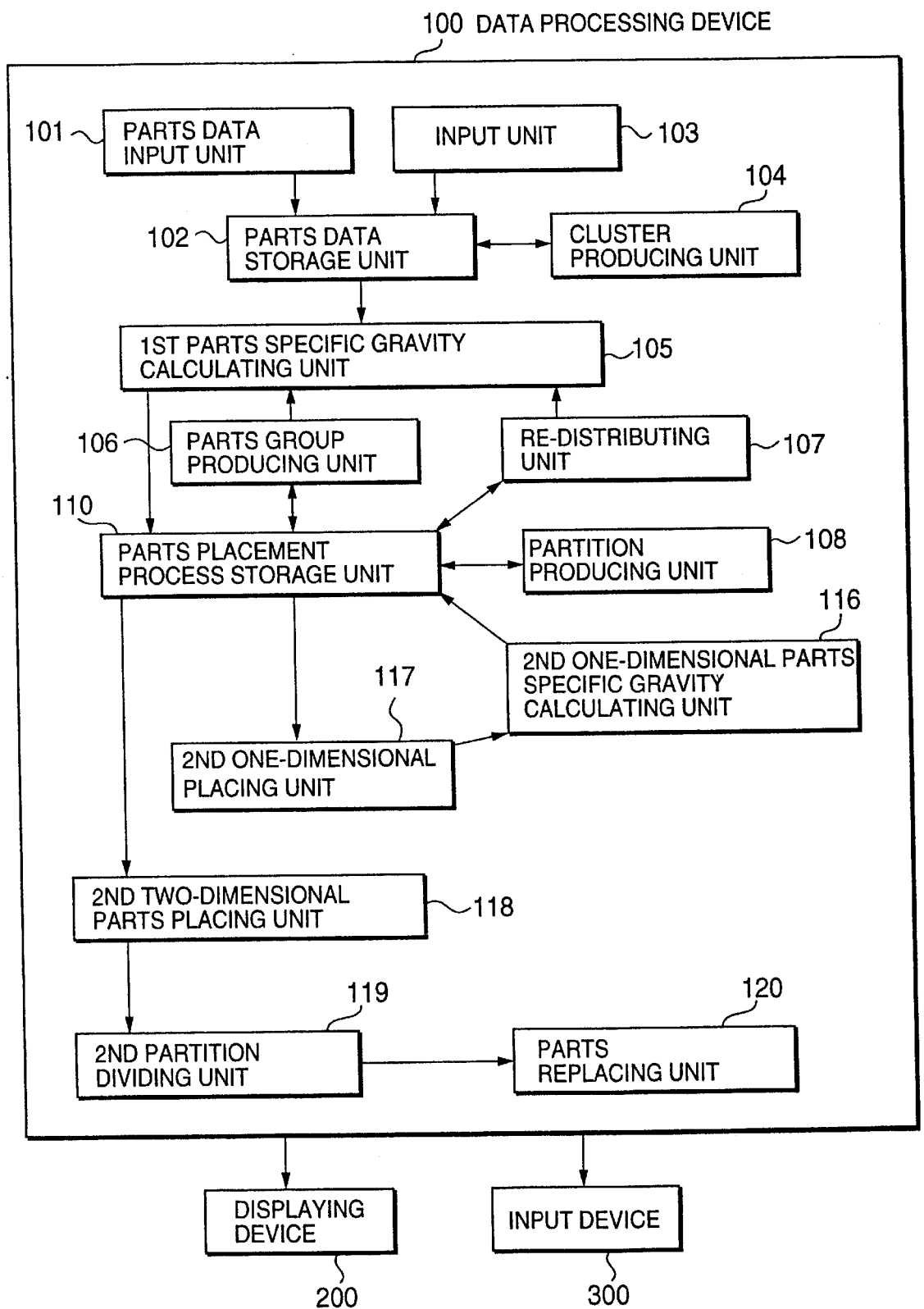
FIG. 18 shows a configuration of a second embodiment of the invention.

Now, description is made about a second embodiment of the invention with reference to FIG. 18.

Also, parts shown in FIG. 18 which correspond to those shown in FIG. 1 are depicted by the same numerals.

An automatic parts placement design device according to the second embodiment of the invention includes the data processing device 100, the display device 200, and the input device 300, like in the first embodiment.

The data processing device 100 further includes, in addition to structural elements of the first embodiment, a second one-dimensional parts specific gravity calculating unit 116, a second one-dimensional placing unit 117, a second two-dimensional parts placing unit 118, a second partition dividing unit 119, and a parts re-placing unit 120.

The second one-dimensional parts specific gravity calculating unit 116 calculates a specific gravity by using the number of nets which connect parts in the direction of the X-axis or the Y-axis of the parts.

The second one-dimensional placing unit 117 aligns the parts in an ascending order of its parts specific gravity along the X-axis or the Y-axis, and stores the order of one-dimensional parts placement to the parts placement process storage unit 110.

The second two-dimensional parts placing unit 118 calculates coordinate values of parts on the two-dimensional plane of the X-Y coordinate, based on first parts positions from a first one-dimensional parts placement and second parts positions from a second one-dimensional parts placement, and approximately places the parts on the two-dimensional plane according to the coordinate values.

The second partition dividing unit 119 divides a partition into a plurality of individual part zones each of which has a minimum part size in directions of the X-axis and Y-axis.

The parts re-place unit 120 moves parts from one individual part zone to another individual part zone so that a single part is included in an individual part zone.

Next, overall operations of the second embodiment of the invention is described with reference to FIGS. 19 through 26.

Figure 20:
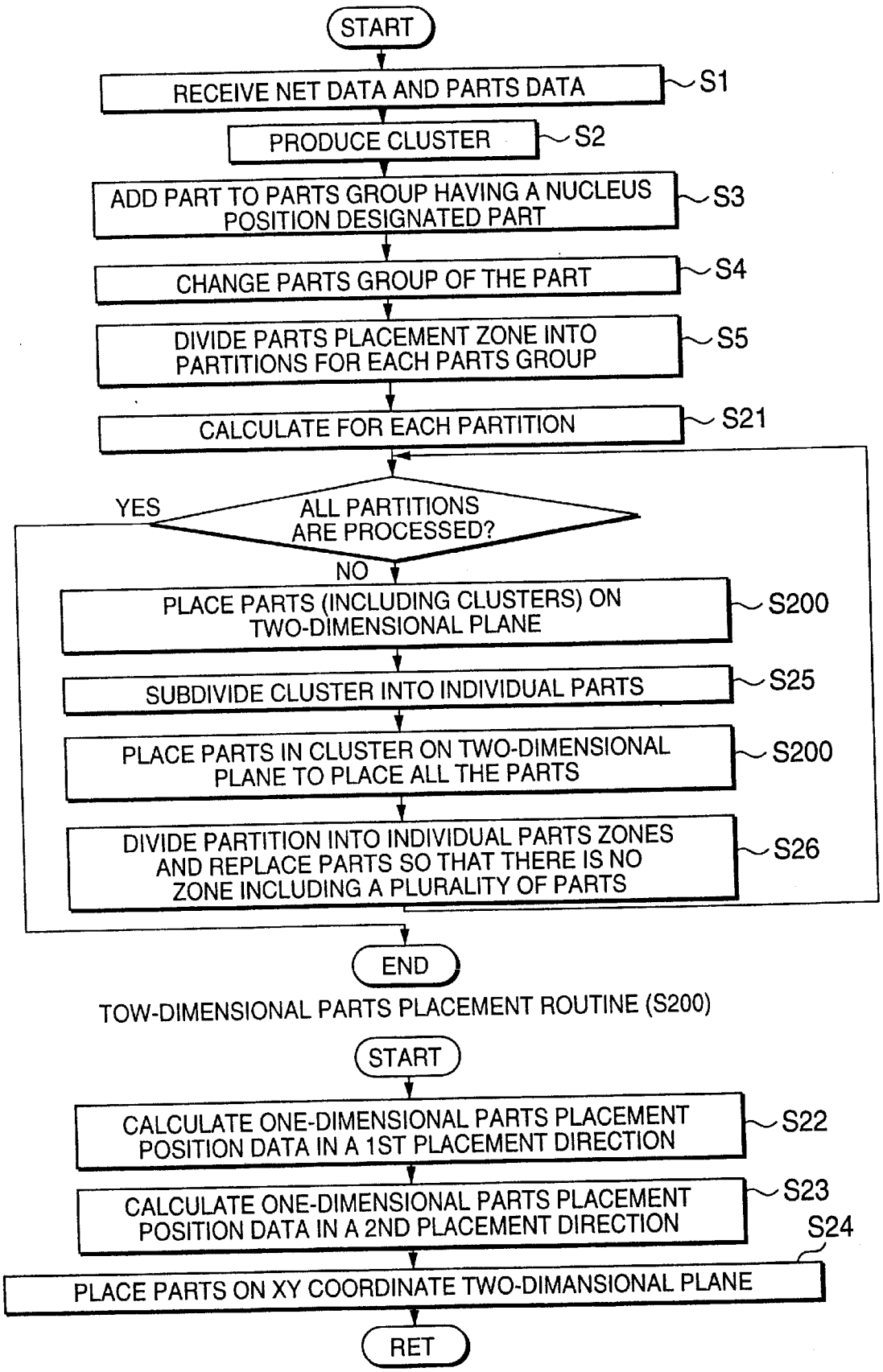
FIG. 20 shows layouts of other data used in the second embodiment of the invention.

In step S1 in FIG. 20, the parts data input unit 101 acquires or produces net data 2001, parts data 2002, and net aggregation data 2003 in a manner similar to the first embodiment.

Then, in steps S2 through S5 of FIG. 20, parts groups are distributed into a plurality of partitions like in the first embodiment.

In step S21, for each partition, parts which are included in each cluster are two-dimensionally placed by step S200 as described later. Then, all the parts are two-dimensionally placed again by step S200 after each cluster is subdivided into individual parts in step S25.

In step S26, a partition is divided into a plurality of individual part zones, and all the parts are each placed in the center of the corresponding partition.

Namely, in step S200, parts are placed from the left side to the right side along the X coordinate axis in step S22 and the parts are further placed from the upside to the downside along the Y coordinate axis in step S23. Finally, the parts are placed two-dimensionally.

Hereinafter, steps 22 through 24 are described with reference to FIG. 20 in more detail.

In step S22, at first, the second one-dimensional parts specific gravity calculating unit 116 projects both a position designated part and previous placed parts in the partition onto a first placement direction of coordinate axis (X coordinate axis).

Figure 24:
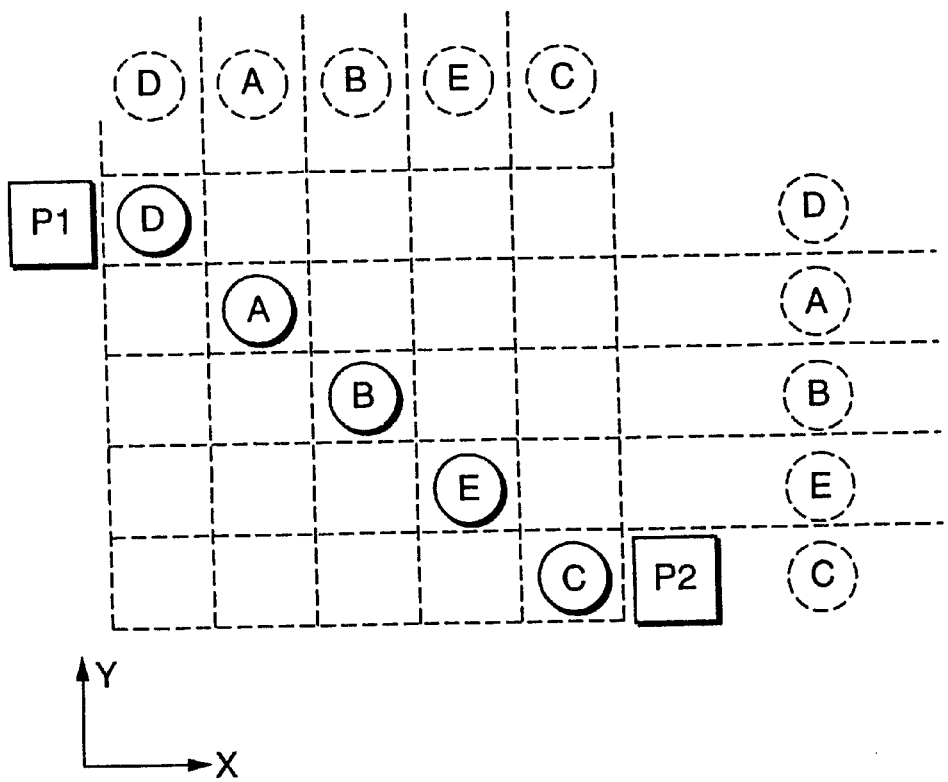

Next, as shown in FIG. 24, a partition is divided into a plurality of zones by vertical division lines. Division is made so that each zone becomes close to a zone of the smallest part. In dividing the partition, X coordinate values of the division lines are determined, and stored into the one-dimensional parts specific gravity data 2006 as a division line position coordinate 1014. The zones divided by the division lines are referred to as "X zones".

Next, a parts specific gravity 1010 by which a part is attracted to an X zone is calculated using the following equation (7).

A parts specific gravity 1010 for attracting a part to an X zone adjacent to a placed part is given by:

([the number of nets which connect the part to other part of the placed part side]–[the number of nets which connect the part to other part of the opposite side]–[the number of nets which connect the part to an unsettled position part])/[an area of the part]   (7)

For example, it is assumed that a parts specific gravity 1010 is calculated and determined which attracts a part to an X zone which is adjacent to the position designated part on the right hand side thereof. The calculation of the parts specific gravity 1010 will be carried out in a following manner.

Firstly, the number of nets which connect the part to the other parts is subtracted from the number of nets which connect the part to parts which reside on the left side of the X zone to calculate a difference between both the numbers. The difference is divided by an area of the part. Further, the quotient is defined as a parts specific gravity 1010 of the part attracted to the X zone.

Then, the second one-dimensional placing unit 117 extracts, from an X zone adjacent to the position designated part, a combination of the X zone having the maximum parts specific gravity 1010 and a candidate part to be placed in the X zone. But, a part of a large area is stored in a plurality of X zones.

After that, the unit 117 stores the extracted part into the corresponding X zone and produces one-dimensional class data 2008 shown in FIG. 19 for the X zone. The one-dimensional class data 2008 includes a nucleus position designated parts name of the X zone 1011, and parts placement order 1016 and parts name 1002 of each part in the X zone.

The unit 117 also reads out a parts name 1002 which has already been stored and are next to the newly stored part from the one-dimensional class data 2008. Then, an X coordinate value of the adjacent part is supplied from the first one-dimensional parts specific gravity data 2006. Next, boundary positions of outward form of the newly stored part in relation to the adjacent part are calculated and the results are stored into position coordinates 1014 of division lines. Further, an x coordinate position of a gravity point of a zone surrounded by the division lines of the part is calculated and is stored into a first one-dimensional parts placement position 1015 of the part. Also, for the newly stored part, the unit 117 produces a first one-dimensional parts specific gravity data 2006. The first one-dimensional parts specific gravity data 2006 includes a parts name 1002 of the part, position coordinates 1014 of the division lines, and the first one-dimensional parts placement position 1015.

Next, the second one-dimensional parts specific gravity calculating unit 116 calculates a parts specific gravity 1010 of a part attracted to an X zone next to the X zone in which the part is placed by the unit 117 as described above.

Then, the unit 117 again extracts another combination of an X zone having the maximum parts specific gravity 1010 and a candidate part to be placed in the X zone. The process is repeated until all the parts in a partition are placed in either one of the X zones.

Also, in step S23, a process similar to the process in step S22 is performed to a second placement direction (a direction along Y-axis). Therefore, similarly to the process of the step S22, the second one-dimensional parts specific gravity 2006 is produced for Y zones. That is, the center of the Y zone on the Y-axis is stored as the second one-dimensional parts placement position.

In step S24, the second two-dimensional parts placing unit 118 places parts on the XY coordinate two-dimensional plane using the first one-dimensional parts placement position of all the parts and the second one-dimensional parts placement position of all the parts.

Next, in step S25, when a cluster is included in a partition, each of the parts placed in step S24 is placed in a position where the part has been placed already and each of parts of the cluster is placed in step S200.

Figure 25A:
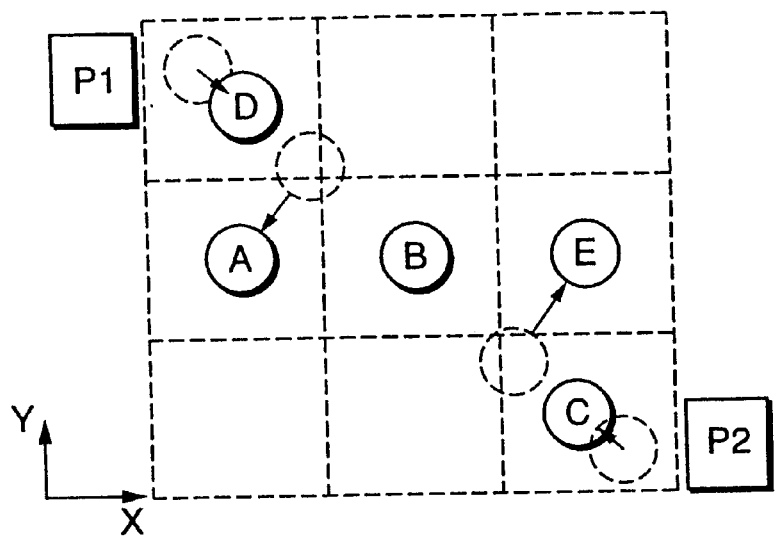
Figure 25B:
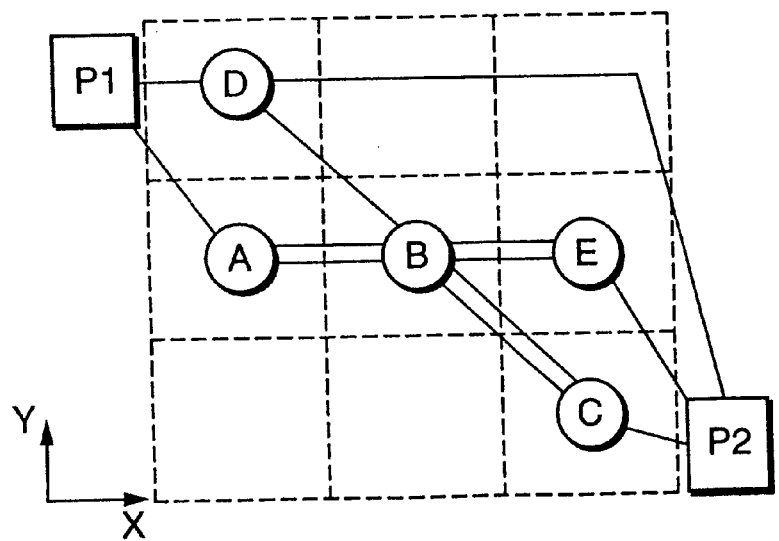

In step S26, the second partition dividing unit 119 equally divides a partition in the direction of X-axis and Y-axis to produce a plurality of individual part zones so that each of the individual part zone has an area close to a zone of the minimum area part as shown in FIGS. 25A and 25B.

Then, in step S26, the parts re-placing unit 120 detects the individual part zone which is filled with a plurality of parts, and calculates attractive force of the part for each part using the following equations (8) through (10).

Adjacent force=total sum of [the number of nets which are connected to parts in adjacent individual part zones]   (8)

Divergence vector=sum of [unit vector having the direction of nets which connect to parts in individual part zones which are not adjacent each other]   (9)

Attractive force=[adjacent force]−[absolute value of divergence vector]   (10)

Here, by moving a part having less attractive force to adjacent individual part zone, it is possible to avoid placing a plurality of parts in the same individual part zone. Also, a part having larger attractive force and a part having many terminals are placed in a plurality of individual part zones according to an area of the part or the number of the independent terminal.

Next, current attractive force of each part at the individual part zone including the part and attractive force which will occur when the part is moved to the adjacent empty individual part zone are calculated using the equations (8) through (10) to determine and store a change of attractive force caused by the moving of the part.

The calculation is executed for each part. Here, the moving of the part which gives a positive and maximum change of attractive force is extracted, the part is moved to the adjacent individual part zone.

Next, for the resulting parts placement, the following processes are repeated.

(1) Calculation is made about a change of attractive force resulting from moving the part again as described above.
(2) Movements are selected such that they give a positive and maximum change of attractive force.
(3) The part is moved to the adjacent individual part zone according to the above extracted result.

The above processes (1) through (3) are repeated until a change of attractive force caused by the moving of the part exceeds zero even if any moving is performed.

Hereinafter, the second embodiment of the invention is described with reference to FIG. 21 though 31 in more detail.

In step S1, position designated parts P1 and P2 and undefined parts A, B, C, D, and E (parts data 2002) are supplied to the parts data input unit 101.

Next, in step S2 in FIG. 20, the cluster producing unit 104 calculates the cluster ABCE including the parts A, B, C, and E to produce the parts data 2002 like in the process of the first embodiment.

Then, in step S3 in FIG. 20, the process is performed similarly to the first embodiment, and the parts group producing unit 106 adds the cluster ABCE and the part D to the P2 parts group.

Figure 21:
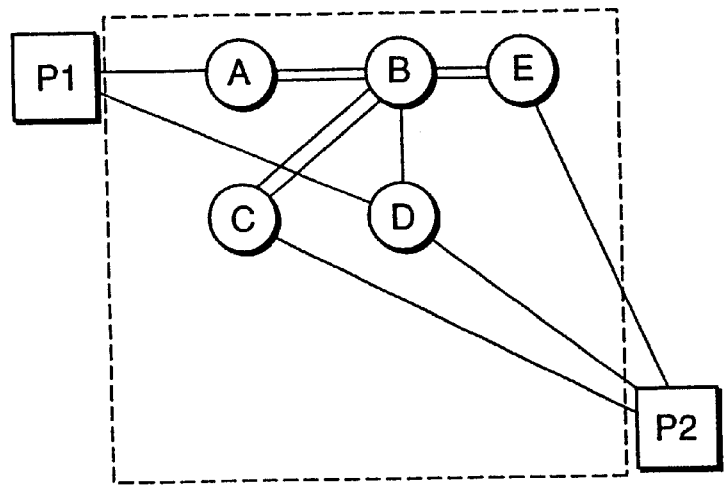
FIG. 21 shows a flowchart of the second embodiment of the invention.

Next, in step S5 in FIG. 20, the process is performed similarly to the first embodiment, the partition producing unit 108 produces partition including the P2 parts group as shown in FIG. 21.

Next, in step S21 in FIG. 20, the part D and the cluster ABCE in the partition related to the P2 part group are processed by the following process in step S200 and the process proceeds to step S25.

Step S200 includes steps S22 through S24.

Hereinafter, steps 22 through 24 are described in more detail. Firstly, the second one-dimensional placing unit 117 divides the partition into five X zones each of which has the minimum part area using vertical lines.

Then, the second one-dimensional parts specific gravity calculating unit 116 calculates, for each part and X zone, a parts specific gravity 1010 in the direction of X-axis, when the part is included in one of the X zones next to the position designated part using the equation (5).

Here, the unit 116 calculates a parts specific gravity 1010 of a part attracted to a first X zone next to the position designated part P1 using the equation (5) and produces the resulting values as follows.

Part D: −1
Cluster ABCE: −2/4

Next, for a parts specific gravity 1010 of a part attracted to a fifth X zone next to the position designated part P2, the following values are obtained.

Part D: −1
Cluster ABCE: 0

Then, the second one-dimensional placing unit 117 extracts the cluster ABCE attracted to the fifth X zone as a combination which gives the maximum parts specific gravity 1010 and places the cluster ABCE in the fifth X zone, a fourth X zone, a third X zone, and a second X zone according to the part area. After that, the cluster ABCE is stored into the one-dimensional parts specific gravity data 2006 of the X zone as parts name 1002. The remaining part D is placed in the first X zone and the part D is stored into the one-dimensional parts specific gravity data 2006 of the X zone as parts name 1002.

Thus, contents of the one-dimensional parts specific gravity data 2006 of X zone are created as follows.

X zone 1 (part D)
X zone 2–5 (cluster ABCE)

In step S23, the unit 117 divides the partition into five Y zones in the direction of Y-axis using horizontal division line.

Next, the unit 116, for each part and Y zone, a parts specific gravity 1010 in the direction of Y-axis, when the part is included in one of the Y zones next to the position designated part using the equation (7).

Here, the unit 116 calculates a parts specific gravity 1010 of a part attracted to a first Y zone next to the position designated part P1 using the equation (7) and produces the resulting values as follows.

Part D: 1
Cluster ABCE: 2/4

Next, for a parts specific gravity 1010 of a part attracted to a fifth Y zone next to the position designated part P2, the following values are obtained.

Part D: −1
Cluster ABCE: 0

Then, the second one-dimensional placing unit 117 extracts the cluster ABCE attracted to the fifth Y zone as a combination which gives the maximum parts specific gravity 1010 and places the cluster ABCE in the fifth Y zone, a fourth Y zone, a third Y zone, and a second Y zone according to the part area. After that, the cluster ABCE is stored into the one-dimensional parts specific gravity data 2006 of the Y zone as parts name 1002.

The remaining part D is placed in the first Y zone and the part D is stored into the one-dimensional parts specific gravity data 2006 of the Y zone as parts name 1002.

Thus, contents of the one-dimensional parts specific gravity data 2006 of Y zone are created as follows.

Y zone 1 (part D)
Y zone 2–5 (cluster ABCE)

Figure 22:
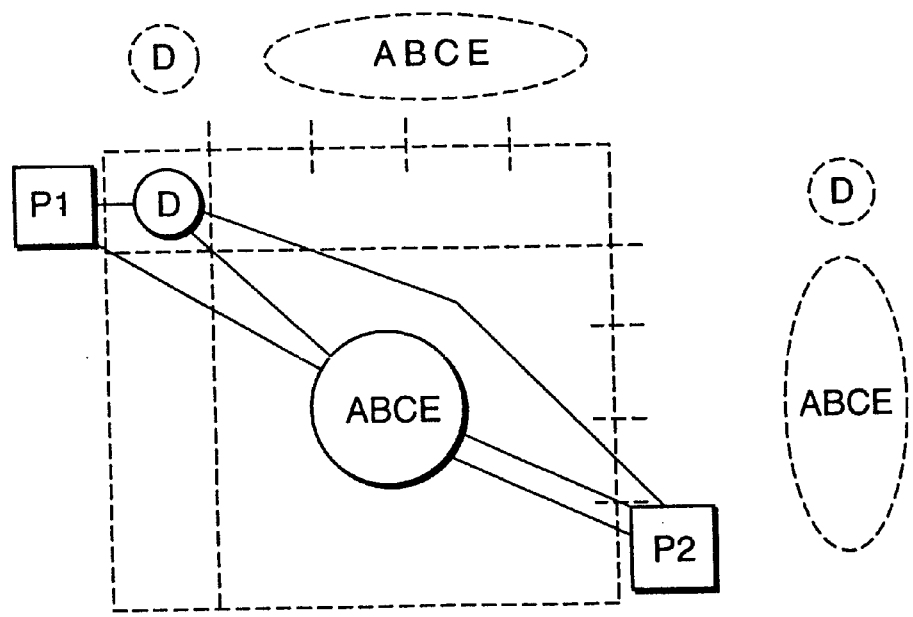
FIGS. 22 through 26 show specific operations of the second embodiment of the invention.

In step S24, the second two-dimensional parts placing unit 118 places the parts on the XY coordinate two-dimensional plane using the parts placement position of X zone and the parts placement position of Y zone as shown in FIG. 22.

As a result, the part D is placed in the upper left of the partition and the cluster ABCE is placed in the lower right of the partition.

Figure 23:
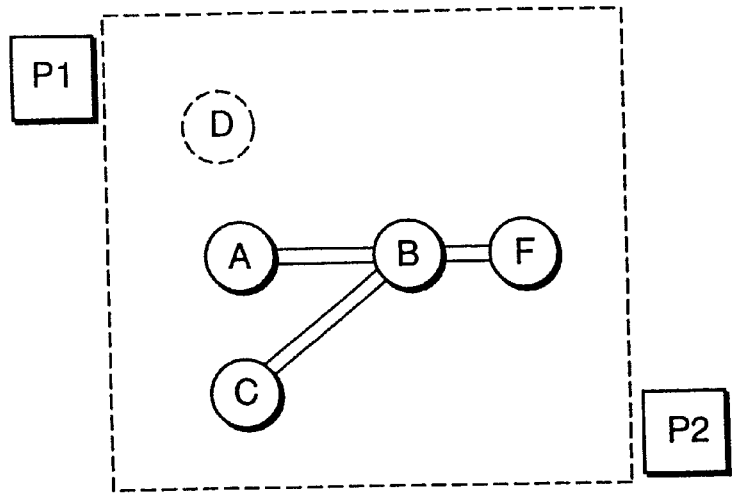

Next, in step S25, from placement of the part D and the cluster ABCE obtained above, the position of the part D shown in FIG. 23 is defined as a part placed position and each of the parts in the cluster ABCE are placed in step S2000.

In step S22 (first step of step S2000), the second one-dimensional placing unit 117 divides, using vertical division lines, the partition of the P2 parts group into five X zones each of which has the minimum part area. The leftmost side of X zone is referred to as a first X zone, an X zone next to the first X zone is referred to as a second X zone, and the rightmost side of the X zone is referred to as a fifth X zone. In FIG. 24, the division lines are denoted as vertical dotted division lines. Here, the placed part D is initially stored in the first X zone.

Then, the second one-dimensional parts specific gravity calculating unit 116 calculates, for each part and X zone, a parts specific gravity 1010 in the direction of X-axis, when the part is included in one of the X zones next to the position designated part using the equation (7).

Here, the unit 116 calculates a parts specific gravity 1010 of an objective part attracted to the second X zone next to the part D and produces the resulting values as follows.

Part A: −1
Part B: −5
Part C: −3
Part E: −3

The calculation includes subtracting, from the number of nets in which the objective part connects to the part D in the first X zone or the position designated part P1, the number of nets in which the objective part connects to the other parts (other than the part D or P1), and dividing the resulting value by an area of the part.

Also, the unit 116 calculates a parts specific gravity 1010 of an objective part attracted to the fifth X zone next to the position designated part P2 by subtracting, from the number of nets in which the objective part connects to the part P2, the number of nets in which the objective part connects to the other part (other than the part P2) and dividing the resulting value by an area of the objective part. The resulting values are as follows.

Part A: −3
Part B: −7
Part C: −1
Part E: −1

Then, the second one-dimensional placing unit 117 extracts a combination, of an X zone and a part, which gives the maximum parts specific gravity 1010. Representing the parts specific gravity 1010 of each combination as (the number of X zone, parts name), there are three combinations which gives maximum parts specific gravity 1010. These combinations are (5, C), (5, E), and (2, A) and the value of the maximum parts specific gravity 1010 is −1.

When the part C attracted to the fifth X zone is selected among the above combinations, the part C is placed into the fifth X zone and information of the part D is stored into the one-dimensional parts specific gravity 2006.

Therefore, a part which changes the parts specific gravity 1010 is the part B connected to the part C. The parts specific gravity 1010 of the part B attracted to the forth X zone next to the part C is calculated by the unit 116 by subtracting, from the number of nets for connecting the part B to the part C of the fifth X zone and to the part P2, the number of nets for connecting the part B to the other parts (other than the parts C and P2). The resultant value is −3.

Next, there are two combinations which give the maximum parts specific gravity 1010. These combinations are (2, A) and (4, E) and the value is −1. Here, the part A (its parts specific gravity is −1) attracted to the second X zone is selected and the part A is added to the second X zone.

As a result, a part which changes the parts specific gravity 1010 in an X zone next to the part A is the part B connected to the part A. The parts specific gravity 1010 of the part B attracted to the third X zone is changed to −1.

Further, there are two combinations which give the maximum parts specific gravity 1010. These combinations are (3, B) and (4, E) and the value is −1. Here, the part B (its parts specific gravity is −1) attracted to the third X zone is selected and the part B is added to the third X zone. After that, information of the part B is stored in the one-dimensional parts specific gravity data 2006.

As a result, a part which changes the parts specific gravity 1010 is the part E connected to the part B. The parts specific gravity 1010 of the part E attracted to the fourth X zone is changed to +3.

Lastly, the remaining part E is added to the fourth X zone.

As described above, the order of addition of parts to X zones (D, A, B, E, and C) is obtained and the order is stored in the one-dimensional parts placement data 2007.

Moreover, in step S23, the second one-dimensional placing unit 117 divides, using horizontal division lines, the partition of the P2 parts group into five Y zones each of which has the minimum part area. The upside of Y zone is referred to as a first Y zone, a Y zone beneath the first Y zone is referred to as a second Y zone, and the bottom side of the Y zone is referred to as a fifth Y zone. In FIG. 24, the division lines are denoted as horizontal dotted division lines. Here, the placed part D is initially stored in the first Y zone.

After performing the processes similarly to step S22 in the direction of Y-axis in step S23, the order of addition of parts to Y zones (D, A, B, E, and C) is obtained. And the order is stored in the one-dimensional parts placement data 2007.

In step S24, the second two-dimensional parts placing unit 118 places the parts on the XY coordinate two-dimensional plane using the parts positions for X zone and the parts positions for Y zone. As a result, the parts D, A, B, E, and C are diagonally placed in a line as shown in FIG. 24.

Next, in step S26, the second partition dividing unit 119 divides the partition into a plurality of individual part zones each of which has an area close to the minimum part area as shown in FIG. 25A. That is, the partition is divided into three zones in the direction of X-axis and into three zones in the direction of Y-axis, consequently into nine individual part zones.

Then, the parts re-placing unit 120 detects that an individual part zone including the parts C and E is a part having two parts.

Next, attractive force attracted to an individual part zone currently including the part C is determined using the equations (8) through (10) as follows.

In calculating the equation (8), nets connecting to the part E in an individual part zone which also includes the part C are out of consideration. Thus, nets in which the part C is attracted to the part P2 in the adjacent individual part zone are added to adjacent force and the value 1 is obtained as adjacent force.

The value of divergence vector calculated by the equation (9) is 2 with considering the number of nets connecting to the part B. The value of attractive force calculated by the equation (9) is −1. Also, attractive force about the part E is calculated and the resulting value is −1. In this case, attractive force of the part E is optionally selected, since there is no difference between these attractive forces.

Then, searching is performed about an empty individual part zone next to the individual part zone currently including the part E. Resulting from the search, an empty individual part zone is found above the individual part zone currently including the part E as shown in FIG. 25A. Here, the part E is moved to the empty individual part zone, and thereby placement of the parts E and C in the same individual zone is avoided.

Next, each of the parts in the individual part zones is moved to the center position of the corresponding individual part zone. Thus, a parts placement is realized as shown in FIG. 25B.

Then, attractive force of each part in the individual part zone currently including the part and attractive force when the part is moved to an empty individual part zone next to the individual part zone currently including the part are calculated via the equations (8) through (10). Therefore, change of attractive force which is caused from the movement of the part is determined.

As a result, attractive force of the part D at current position is −1 and attractive force when the part D is moved to an empty individual part zone which is next to and is the right side of the zone currently including the part D is +0.2. Therefore, change amount of attractive force is +1.2.

Results of calculating about each part are shown as follows.

Part D: −1, when moved to a right zone: +0.2, change amount: +1.2

Part A: +1, when moved to a downside zone: −2.5, change amount: −3.5

Part B: +3, when moved to a upside zone: −3.7, change amount: −6.7

Part B: +3, when moved to a downside zone: −1.7, change amount: −4.7

Part E: +1, when moved to a upside zone: −2.5, change amount: −3.5

Part C: −1, when moved to a left side zone: +1, change amount: +2

Figure 26:
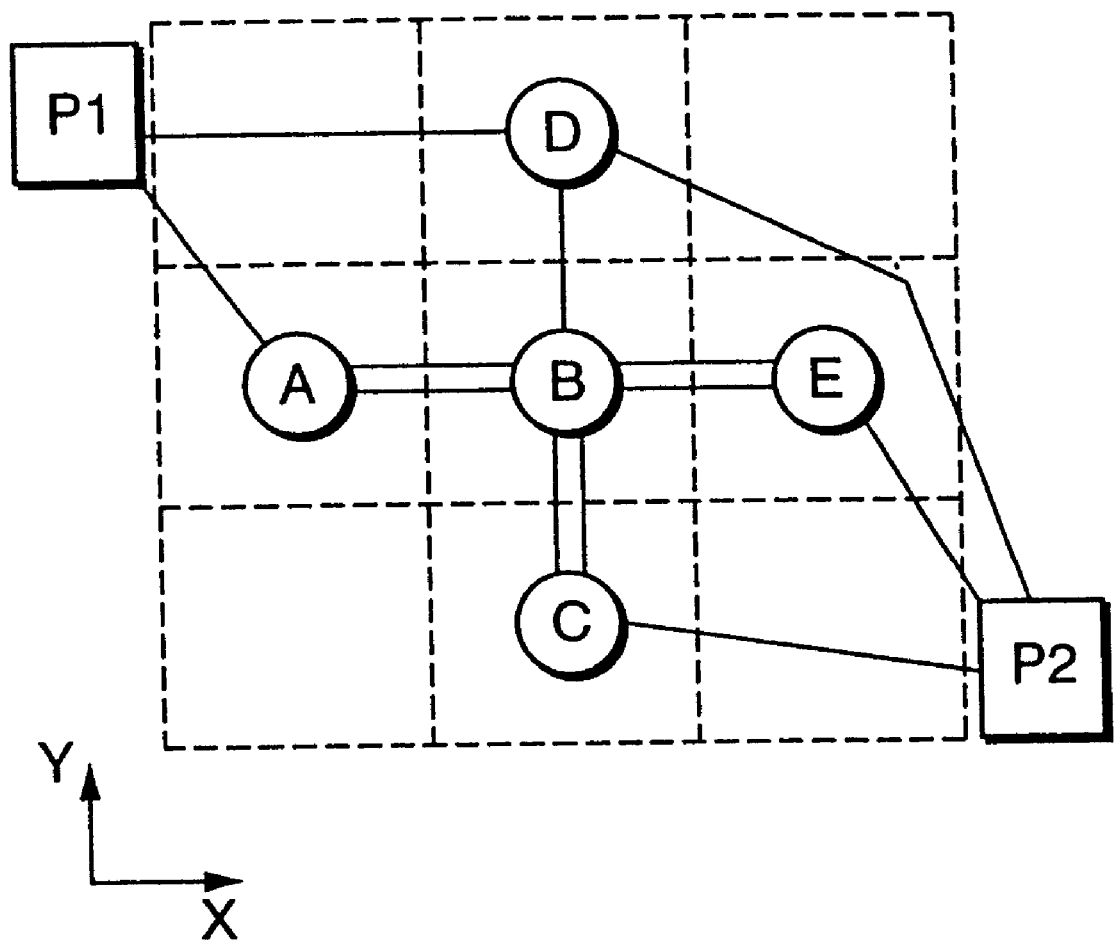

From the results, it is found that the change amount about the part C is positive value and the largest. Therefore, the part C is moved to the left side zone. Further, the part D, whose change amount is positive and the second largest, is moved to the right side zone, consequently, a placement shown in FIG. 26 is given.

Figure 27:
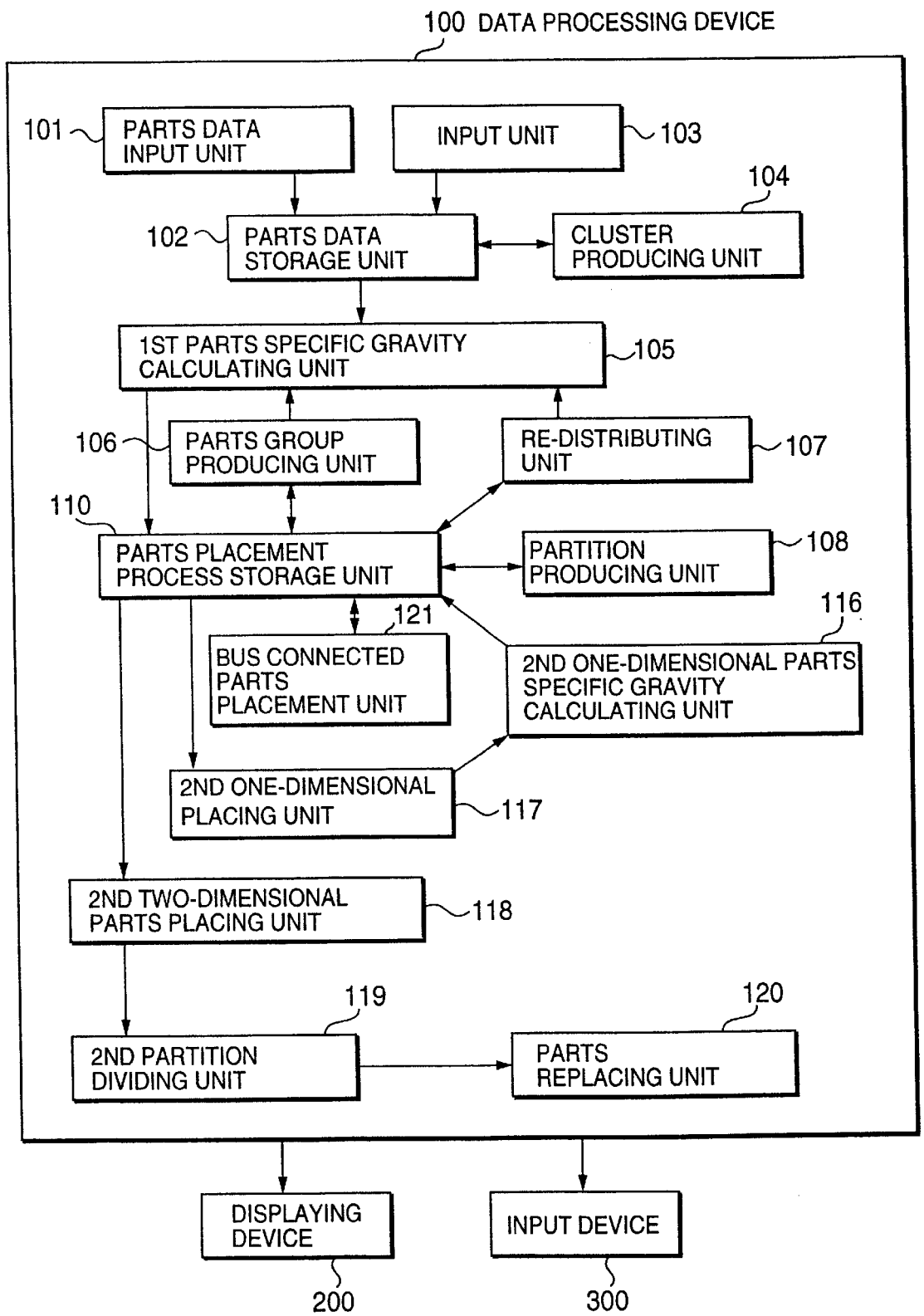
FIG. 27 shows a configuration of a third embodiment of the invention.

Now, description is made about a third embodiment of the invention. As shown in FIG. 27, the third embodiment of the invention includes the data processing device 100, the display device 200, and the input device 300 similarly to the second embodiment.

In the third embodiment of the invention, the data processing device 100 further includes, in addition to the configuration of the second embodiment, a bus connected parts placement unit 121.

The bus connected parts placement unit 121 designates a direction of placement of a designated bus connected part as a first placement direction. Further, the unit gathers a set of the designated bus connected parts into a cluster and a certain value is set to each of relative position coordinate values of the parts.

Next, overall operations of the third embodiment of the invention is described with reference to FIG. 28 in more detail.

Figure 28:
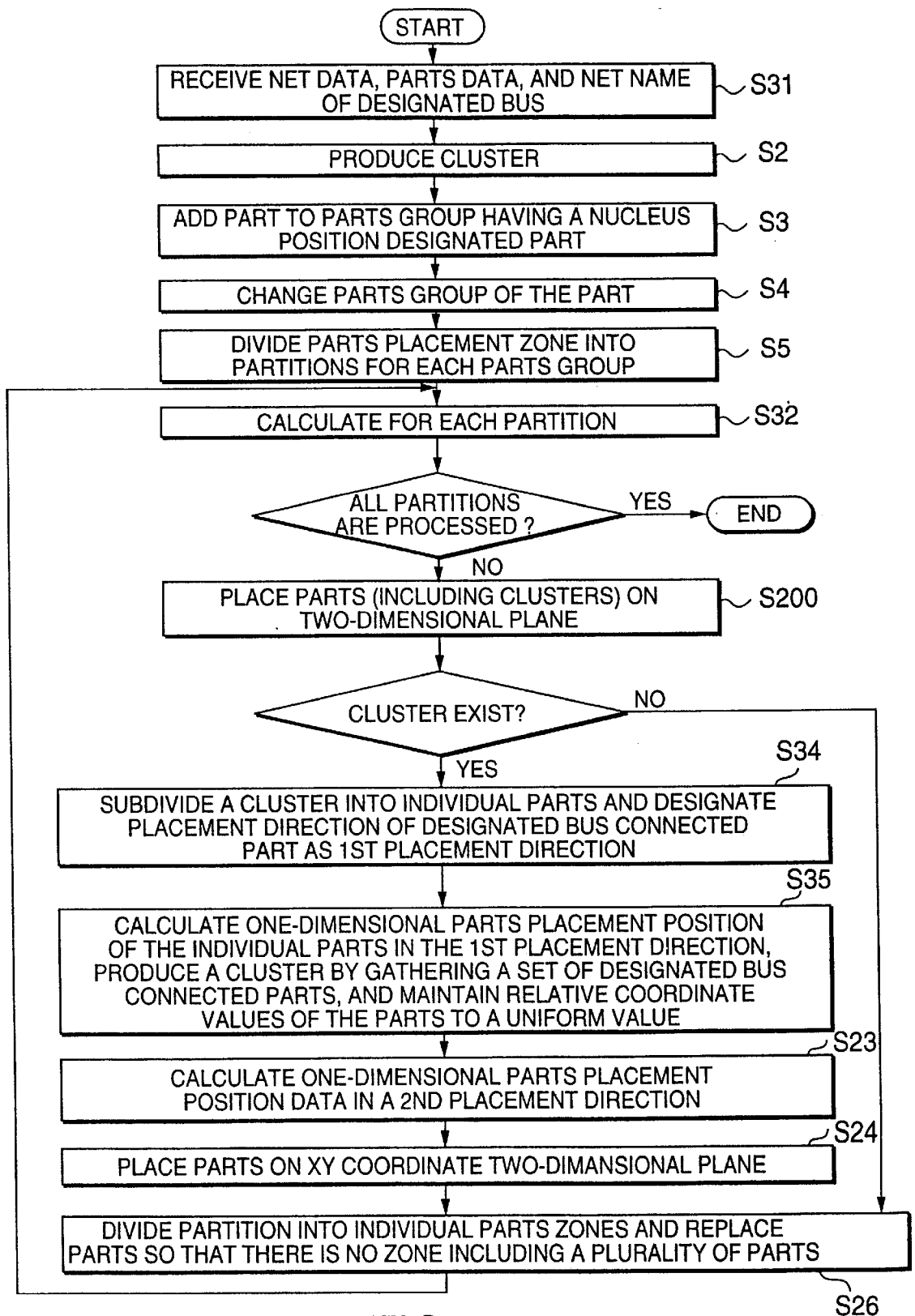
FIG. 28 shows a flowchart of the third embodiment of the invention.

In step S31 in FIG. 28, the part data input unit 101 acquires or produces net data 2001, part data 2002, and net aggregation data 2003 similarly to the second embodiment. Further, the unit 101 acquires or produces net name data of designated bus wiring.

Then, in steps S2 through S5, parts groups are distributed a plurality of partitions similarly to the first embodiment.

In step S32, for each partition, the following steps S200, S33, S34, S35, S23, S24, and S26 are repeated and when all the partitions are processed, the process is completed.

Namely, in step S200, parts are placed on the XY coordinate two-dimensional plane, in step S33, it is determined whether there is a cluster or not, and in steps S34 through S26, the cluster is developed into individual parts and placed two-dimensionally.

In step S200, the second two-dimensional parts placing unit 118 places, similarly to the second embodiment, the parts on the XY coordinate two-dimensional plane using positions of X zones and positions of Y zones for all the parts. Then the process proceeds to step S33.

In step S33, it is determined whether there is a cluster in the partition or not, when there is a cluster, steps are performed in the order of S34, S35, S23, S24, S26. If there is no cluster, the process directly proceeds to step S26.

In step S34, the bus connected parts placement unit 121 it is determined whether or not there is a part connecting to a net of the designated bus wiring among parts in the cluster. If there is a part, the input unit 103 informs an operator of the information by highlighting the parts name on the display device 200.

In response to designation of a placement zone and a placement direction (a first placement direction) of apart connected to a designated bus from the operator, the unit 121 stores the designation. A direction perpendicular to the first placement direction is referred to as a second placement direction.

For example, designation of placing parts group connected to a designated bus wiring in the X-axis direction or Y-axis direction in a line, or designation of placing parts group in the X-axis direction or Y-axis direction in two or more lines.

Here, when the unit 121 determines no existence of the part and receives no designation, the X-axis is designated as the first placement direction and the Y-axis is designated as the second placement direction.

In step S35, at first, the unit 121 defines the position in which the individual part is placed by step S200 as placed position, develops parts in the cluster into the individual parts, and calculates a first one-dimensional part placement position data of the parts in the first direction.

Then, the bus connected parts placement unit 121 gathers the designated bus connected parts to produce a cluster and stores a relative position coordinate values 1016 of each part to a gravity point of the cluster as part data 2002 of the cluster. The relative position coordinate values 1016 of the parts are maintained to a uniform value.

In step S23, for the cluster produced in step S35 and the remaining parts, the second one-dimensional placing unit 117 calculates one-dimensional parts placement position data 2007 to be used in placing in the second direction similarly to the second embodiment.

In step S24, the second two-dimensional parts placing unit 118 places the parts on the XY coordinate two-dimensional plane using parts positions in the X zone and parts positions in the Y zone, similarly to the second embodiment.

In step S26, the partition is divided into a plurality of individual part zones each of which has an area similar to the minimum part area in the X direction and the Y direction. As the result of the above dividing, when a plurality of parts reside in a single individual part zone, attractive force is calculated for each part in the individual part zone using the equations (8) through (10).

Then, it is ensured that a single part is placed in a single individual part zone by moving parts with less attractive force to another individual part zone. Next, the process returns to step S32 (step S26).

Hereinafter, overall operations of the third embodiment of the invention is described in more detail.

Figure 29:
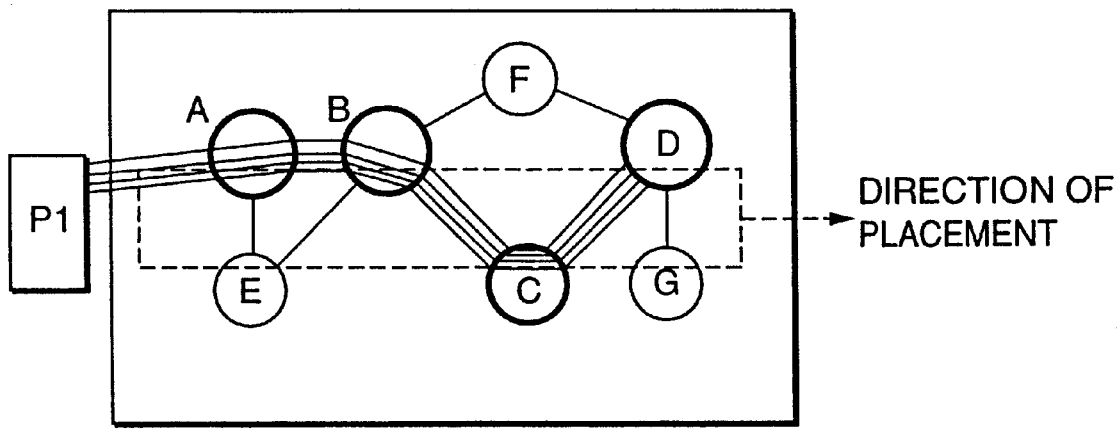
FIGS. 29 through 33 show specific operations of the third embodiment of the invention.

In step S31, the part data input unit 101 acquires or produces part data 2002 including a position designated part P1 and undefined parts A, B, C, D, E, F, and G as shown in FIG. 29.

Then, in steps S2, the cluster producing unit 104 executes calculation for a cluster ABCDEFG gathering the parts A B, C, D, E, F, and G, and produces parts data 2002.

In steps S3 and S4, the parts group producing unit 106 makes the cluster ABCDEFG a part of the P1 parts group.

In step S5, the partition producing unit 108 produces a partition including P1 parts group as shown in FIG. 29.

In step S200, the cluster ABCDEFG in the P1 parts group is placed. But, in this example, the cluster ABCDEFG is merely put in the partition.

In step S33, existence of the cluster ABCDEFG is detected, and the process proceeds to next step S34.

In step S34, the bus connected parts placement unit 121 extracts a part connected via a designated bus wiring net in the parts in the cluster. As a result, it is detected that the parts A, B, C, and D in the cluster ABCDEFG are connected each other via four designated bus wiring net, and operators receive information the parts A, B, C, and D are detected by highlighting the list corresponding to the parts on the display device.

Next, the input unit 103 receives instruction that a first placement direction of a part connected to the designated bus is the X direction from an operator.

Figure 30:
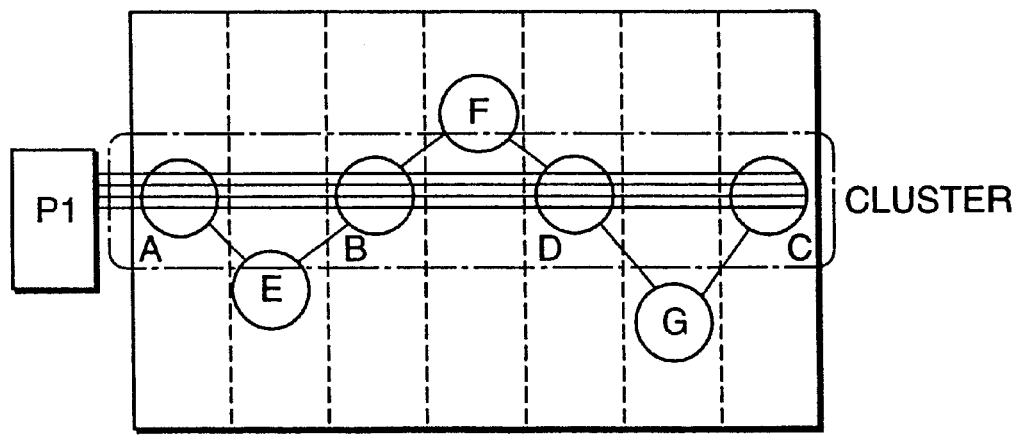

In step S35, the second one-dimensional placing unit 117 divides the P1 parts group with vertical partitioning lines each of which is perpendicular to the X axis to produce seven zones, a first zone through a seventh zone, having the same area as shown in FIG. 30.

Next, a parts specific gravity 1010 of a part attracted to the first X zone next to the position designated part P1 is determined by subtracting, from the number of nets which connect the part to the P1 parts group, the number of nets which connect the part to other part and by dividing the result of the subtracting by an area of the part.

The result of calculating is as follows.

Part A: −1
Part B: −2
Part C: −1
Part D: −2
Part E: −2
Part F: −2
Part G: −2

In this calculation, four nets connecting the part P1 to the parts A, B, C, and D are offset, since although the parts A, B, C, and D are attracted to the part P1, there are the remaining parts connected to the nets.

Next, the second one-dimensional placing unit 117 searches into the partition from the end of the X axis and extracts combinations of an X zone and a part which provide with the maximum parts specific gravity 1010. In this case, at first, the part A (parts specific gravity value=−1) is extracted as being attracted to the first X zone, and the part A is stored in the first X zone.

As a result, it is found that a part which changes a parts specific gravity 1010 is the part E connected to the part A. A parts specific gravity of the part E when the part is attracted to the second X zone is determined by dividing, from the number of nets which connect the part E to the first X zone, the part A, and the part P1, the number of nets which connect the part E to the other parts and the resulting value is zero.

Parts specific gravities of parts other than the part E when attracted to the second X zone take over the parts specific gravities when attracted to the first X zone.

Next, the part E attracted to the second X zone (the parts specific gravity=0) is selected as a combination provides with the maximum parts specific gravity 1010 and the part E is stored in the second X zone. Consequently, it is found that a part which changes a parts specific gravity 1010 is the part B connected to the part E. Then, the parts specific gravity of the part B when attracted to the third X zone becomes zero.

Then, the part B attracted to the third X zone (the parts specific gravity=0) is selected as a combination provides with the maximum parts specific gravity 1010 and the part B is stored in the third X zone. Consequently, it is found that a part which changes a parts specific gravity 1010 is the part F connected to the part B. Then, the parts specific gravity of the part F when attracted to the fourth X zone becomes zero.

Next, the part F attracted to the fourth X zone (the parts specific gravity=0) is selected as a combination provides with the maximum parts specific gravity 1010 and the part F is stored in the fourth X zone. Consequently, it is found that a part which changes a parts specific gravity 1010 is the part D connected to the part F. Then, the parts specific gravity of the part D when attracted to the fifth X zone becomes zero.

Next, the part D attracted to the fifth X zone (the parts specific gravity=0) is selected as a combination provides with the maximum parts specific gravity 1010 and the part D is stored in the fifth X zone. Consequently, it is found that a part which changes a parts specific gravity 1010 is the part G connected to the part D. Then, the parts specific gravity of the part G when attracted to the sixth X zone becomes zero.

Next, the part G attracted to the sixth X zone (the parts specific gravity=0) is selected as a combination provides with the maximum parts specific gravity 1010 and the part G is stored in the sixth X zone. Consequently, it is found that a part which changes a parts specific gravity 1010 is the part C connected to the part G.

Herein, since the remaining part connected via nets connecting to the parts P1 through D is the part C only, the nets are not offset. Therefore, the calculation is performed in consideration of the fact that the part C is also attracted by the nets. As a result, the parts specific gravity of the part C when attracted to the seventh X zone becomes plus five.

Next, a combination which provides with the maximum parts specific gravity 1010 is extracted and the part C attracted to the seventh X zone (parts specific gravity=5) is selected and added to the seventh X zone.

As described above, the order of parts placement in the X direction is determined as the following order and stored in one-dimensional parts placement data 2007.

A,E,B,F,D,G,C

Next, as shown in FIG. 30, the bus connected parts placement unit 121 gathers the parts A, B, D, and C to produces a cluster, and places the parts in the X direction in a line. A relative position coordinate value 1016 of each part is stored as part data 2002 of the cluster ABDC.

Figure 31:
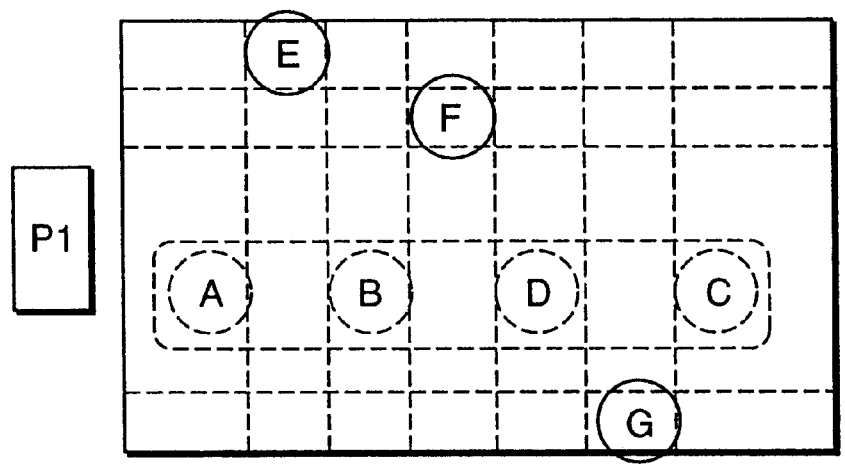

In step S23, as shown in FIG. 31, the second one-dimensional placing unit 117 places the cluster ABDC and the parts E, F, and G in a line, and produces second one-dimensional parts placement data 2007 in the Y direction as the following order.

E, F, cluster ABDC, G

In step S24, the second two-dimensional parts placing unit 118 places the parts on the XY coordinate two-dimensional plane using positions of the part on the X zone and positions of the part on the Y zone, and consequently, produces two-dimensional placement of the parts shown in FIG. 31.

Figure 32:
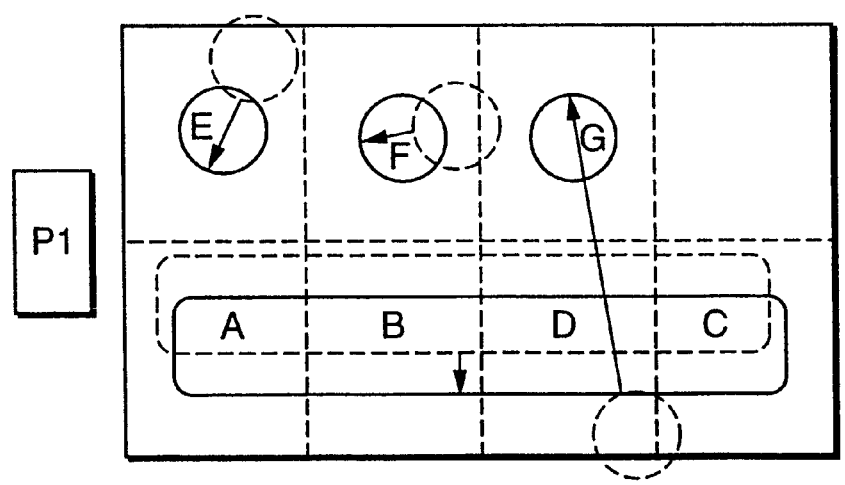

In step S26, as shown in FIG. 32, the parts re-placing unit 120 divides the partition into four zones equally in the X direction and divides the partition into two zones equally in the Y direction, and finally produces eight individual part zones.

Then, the parts re-placing unit 120 moves each of the parts E and F to the center of the individual part zone in which the part is to be stored. Further, the unit 120 detects that the individual part zone including the part G also includes the part D of the cluster ABDC.

Next, attractive force by which the part G is attracted to the individual part zone currently including the part G is calculated using the equations (8) through (10) as follows.

Using the equation (8), the number of nets which the part G is attracted to an adjacent zone including the part C and another adjacent zone including the part D is added to adjacent force. Then the value of the adjacent force become two.

Using the equation (9), it is found the divergence vector is zero. Also, a value of the attractive force is two through the equation (10).

Next, attractive force attracting the cluster ABDC to the individual part zone currently including the cluster is calculated as follows.

At first, using the equation (6), the number of nets of designated bus wiring which connect the cluster ABDC to the adjacent position designated part P1 (=4), is added to adjacent force and the adjacent force is stored.

Then, the number of nets which the part A is attracted to the part E in the adjacent part zone (=1), is added to the adjacent force.

Next, the number of nets which the part B is connected to the adjacent part F (=1), is added to the adjacent force. On the other hand, unit vector with the direction that the part B is attracted to the part E by a net (−0.7, 0.7) is added to divergence vector calculated via the equation (7).

After that, unit vector with the direction that the part D is attracted to the part F by a net (−0.7, 0.7) is added to divergence vector. Further, the number of nets which connect the part D to the part G in the same individual part zone of the part D (=1), is added to the adjacent force.

Next, the number of nets which connect the part C to the adjacent part G (=1), is added to the adjacent force.

Resulting from the above calculation, the adjacent force is determined to eight, and the divergence vector (X, Y) is (−1.4, 1.4).

Using the equation (10), attractive force is determined to six by subtracting absolute value of the divergence vector (=6), from the adjacent force of the cluster ABDC (=8).

The part G which has the smaller attractive force is selected after comparing the attractive force of the part G (=2) with the attractive force between the cluster ABDC and the part G (=6). Then, an empty individual part zone next to the part G is searched. In fact, the upper side of individual part zone is found, and the problem of duplicate placement is solved by moving the part G to the upper side individual part are.

Also, the cluster ABDC is placed so that the gravity point of a set of the parts A, B, D, and C is coincident with the gravity point of a set of individual part zones corresponding to the parts.

Figure 33:
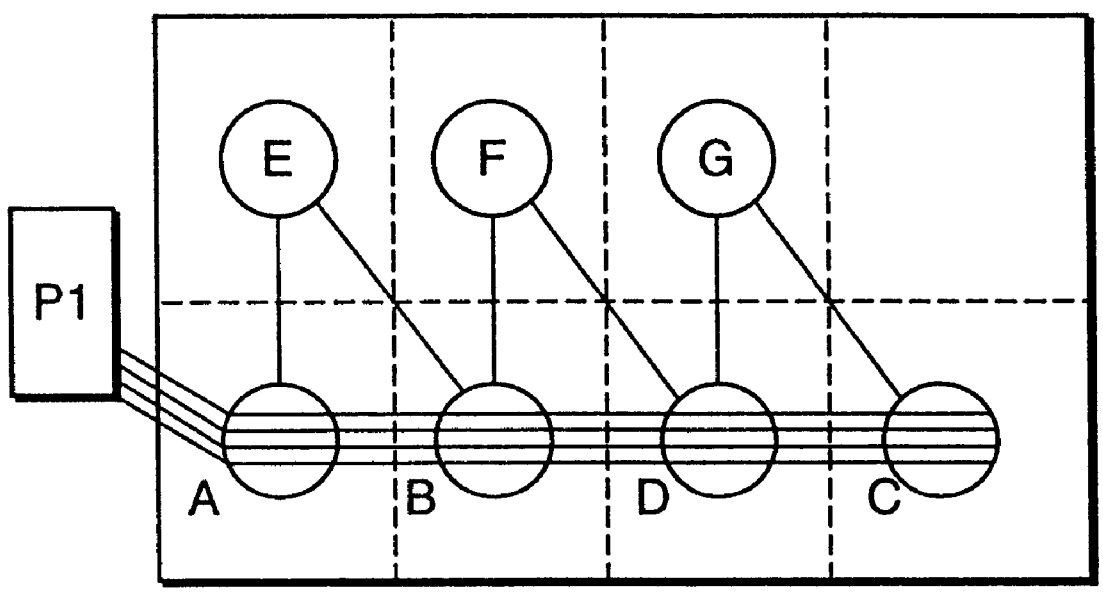

As described above, parts placement is given in which a configuration of designated bus wiring which connects to the parts is not changed since uniform relative positions among the parts in the cluster ABDC are maintained as shown in FIG. 33.

According to the third embodiment of the invention, design of parts placement can be performed without changing a configuration of bus wiring since the bus connected parts placement unit 121 can designate a placement direction of a part connected to a net of designated bus wiring or can produce and place a cluster with keeping relative position among parts thereof.

Further, in the above example, the part placement system about the printed wiring board is illustrated. The invention, however, is not limited to automatic parts placement on the printed wiring board. The system according to the invention may be applied to various systems which automatically places a plurality of parts connected each other.

As described above, according to the invention, parts placement positions in which the shortest total wiring length is realized can be obtained by determining placement positions of all the parts via a single calculation process without changing positions of the part trial and error. Thereby, parts placement in which total wiring length is close to the shortest length can be determined in a short time.

Also, according to the invention, it is possible to shorten the total wiring length of parts placement as compared with the conventional method which is determined by the "gravity point method".

This is because that, in the present invention, the shortest wiring length of parts is determined using relationship about total potential energy of material on physical phenomenon. That is, when parts specific gravity of a part is large, the part is placed in downside to have the smallest potential energy. Thus, parts specific gravities of all the parts are calculated in one-dimensional coordinate direction and lastly one-dimensional parts placement having the smallest parts specific gravity is determined. Thereby, the number of operations can be reduced.

In the invention, the number of calculating for parts placement is at most about $N^2$ (N is the number of parts). On the other hand, in the prior art, the number of calculating is about N!. Therefore, the method and system of the invention can determine parts placement providing with total wiring length close to the shortest possible wiring length with enough less computational complexity.

What is claimed is:

1. An automatic parts placement system comprising:
   a storage device which stores net data of a net connecting between terminals of parts, parts data, and position data of position designated parts;
   a deriving unit which derives parts group from a plurality of parts;
   a partition producing unit which divides a parts placement zone into a plurality of partitions according to the total area of all the parts in the parts group, each partition having a predetermined shape and being related to the parts group;

a parts specific gravity calculating unit which calculates, for each partition, a parts specific gravity of a undefined part by subtracting, from the number of nets connecting between placed parts and the undefined part in the partition, the number of other nets connected to the undefined part, and by dividing the result of subtracting by the area of the undefined part;

a one-dimensional placing unit which places the undefined parts nearby the placed part in descending order of the parts specific gravity on a first one-dimensional axis to produces a first one-dimensional parts placement, and which places the undefined parts adjacent to the placed part in the descending order of the parts specific gravity on a second one-dimensional axis perpendicular to the first one-dimensional axis to produces a second one-dimensional parts placement; and a two-dimensional placing unit which places, for each partition, the undefined parts on a two-dimensional plane by using the first one-dimensional parts placement and the second one-dimensional parts placement.

2. The system of claim 1, wherein the storage device includes a cluster producing unit which when the number of nets connecting one of the undefined parts to other parts is larger than the number of the other nets connecting between other parts, produces a cluster including a set of the undefined part and the other parts connected to the undefined part, and the two-dimensional placing unit includes a subdividing unit which after the cluster is placed in a manner similar to the parts, subdivides the parts included in the cluster.

3. The system of claim 1, the system further comprising:

a part adding unit which calculates parts specific gravities of parts being not included in the parts group derived by the deriving unit, and adds the parts to the parts group in descending order of its parts specific gravity.

4. The system of claim 2, the system further comprising:

a part adding unit which calculates parts specific gravities of parts being not included in the parts group derived by the deriving unit, and adds the parts to the parts group in descending order of its parts specific gravity.

5. The system of claim 1, the system further comprising:

a quadrilateral deriving unit which derives any shape of quadrilateral including a set of parts placed by the two-dimensional placing unit; and a mapping unit which maps the quadrilateral to a rectangular shape in the partition and maps the positions of the parts and the quadrilateral in the partition.

6. The system of claim 1, wherein the two-dimensional placing unit comprises:

a dividing unit which divides the parts group in the partition into a plurality of parts or parts groups and subdivides the partition into a plurality of divided zones by the use of vertical and horizontal division lines according to an area of the divided part or parts group;

a parts group dividing unit which divides the parts group until all the parts are each included in a single divided zone; and a center placing unit which places the part in the center of the divided zone.

7. The system of claim 1, wherein the two-dimensional placing unit comprises:

a divided zone deriving unit which produces divided zones by equally dividing the partition in the direction of two-dimensional coordinate axes which are perpendicular to each other;

an attractive force calculating unit which determines attractive force directed to a part zone by calculating adjacent force which is the number of nets connecting the part to other parts in the zones next to the part, by calculating, for each net connecting the part to other parts in the zones not next to the part, unit vector directed to the direction of the connected part, by calculating divergence vector which is the sum of the unit vector, and by calculating the part's attractive force to the part zone which is determined by subtracting an absolute value of the divergence vector from the adjacent force; and a first part moving unit which moves the part to the other zone in ascending order of the attractive force when a plurality of parts resides in a single divided zone.

8. The system of claim 7, wherein the two-dimensional placing unit comprises a second part moving unit which determines the divided zone which has stronger attractive force when the part is moved to the next divided zone, and moves the part to the determined zone.

9. The system of claim 1, wherein the storage device stores net name data of a designated bus wiring, and the system comprises:

a part data producing unit which determines a cluster including a set of parts which connect to the designated bus wiring, and produces part data storing relative positions of the parts in the first one-dimensional parts placement as relative positions of parts in the cluster; and a part placement calculating unit which calculates parts placement with keeping the relative position of the parts in the cluster.

10. An automatic parts placement device which automatically places parts on two-dimensional parts placement zone, the device comprising:

a part data input device which inputs shapes and areas of the parts and net data of nets connecting between the parts, and stores them to a storage device;

an operational instruction input device which designates placement position of a position designated part in response to an operational instruction;

a cluster producing unit which produces a cluster including parts each of which has strong net connectivity;

a first parts specific gravity calculating unit which derives a parts specific gravity for each combination of a part and a parts group;

a parts group producing unit which adds a part to a parts group having a plurality of parts around the position designated part;

a re-distributing unit which moves a part from a current parts group to another parts group which has stronger connectivity to the part;

a partition producing unit which produces a rectangular shape of partition by dividing a parts placement zone according to a ratio of an area of the parts group;

a one-dimensional parts specific gravity calculating unit which calculates a parts specific gravity based on the number of nets connecting in the direction of a one-dimensional coordinate axis of the part;

a one-dimensional lining unit which lines the parts on a first one-dimensional coordinate axis in order of the parts specific gravity to store the parts placement as first one-dimensional parts placement, and lines the parts on a second one-dimensional coordinate axis perpendicular to the first one-dimensional coordinate axis in order of the parts specific gravity to store the parts placement as second one-dimensional parts placement;

a two-dimensional part placing unit which schematically places the part using the first one-dimensional parts placement and the second one-dimensional parts placement;

a layout mapping unit which maps, for each partition, parts placement to the partition by determining a quadrilateral including all the parts schematically placed by the two-dimensional part placing unit, and by transforming the quadrilateral to the partition; and a partition dividing unit further divides the parts placement mapped by the layout mapping unit into a plurality of zones for each part, and places the parts in said plurality of zones.

11. The device of claim 10, wherein the one-dimensional parts specific gravity calculating unit calculates a parts specific gravity of a undefined part by subtracting from the number of nets connecting the undefined part in the partition to placed parts, the number of nets connecting the undefined part to other parts, and by dividing the result by the area of the undefined part.

12. An automatic parts placement device which automatically places parts on two-dimensional parts placement zone, the device comprising:

a part data input device which inputs shapes and areas of the parts and net data of nets connecting between the parts, and stores them to a storage device;

an operational instruction input device which designates placement position of a position designated part in response to an operational instruction;

a cluster producing unit which produces a cluster including parts each of which has strong net connectivity;

a first parts specific gravity calculating unit which derives a parts specific gravity for each combination of a part and a parts group;

a parts group producing unit which adds a part to a parts group having a plurality of parts around the position designated part;

a re-distributing unit which moves a part from a current parts group to another parts group which has stronger connectivity to the part;

a partition producing unit which produces a rectangular shape of partition by dividing a parts placement zone according to a ratio of an area of the parts group;

a second one-dimensional parts specific gravity calculating unit which calculates a parts specific gravity based on the number of nets connecting in the X-axis direction of the XY coordinate two-dimensional plane or in the Y-axis direction of the XY coordinate two-dimensional plane;

a second one-dimensional lining unit which lines the parts along the X-axis in order of the parts specific gravity to store the parts placement as first one-dimensional parts placement, and lines the parts along the Y-axis perpendicular to the X-axis in order of the parts specific gravity to store the parts placement as second one-dimensional parts placement;

a second two-dimensional part placing unit which schematically places the part on the XY coordinate two-dimensional plane using the first one-dimensional parts placement and the second one-dimensional parts placement;

a second partition dividing unit which further divides the parts placement zone into a plurality of an individual part zones using a first lines parallel to the X-axis and a second lines parallel to the Y-axis, the lines being defined with the interval of the minimum area of the part; and a parts replacing unit which replaces the part by moving the part to another individual part zone so that there is one or no part in every individual part zone.

13. The device of claim 11, wherein the device further includes a bus connected part placing unit which inputs net name data of a designated bus wiring, gathers parts connecting to the designated bus wiring to produce a cluster, determines relative position coordinate values of the parts in the cluster relative to a gravity point of the cluster, and determines parts placement assuming that the relative position coordinate values of the parts in the cluster are uniform.

14. A method of automatically placing parts comprising the steps of:

(a) inputting net data of a net connecting between terminals of parts, parts data, and position data of position designated parts;

(b) deriving parts group from a plurality of parts;

(c) producing a partition by dividing a parts placement zone into a plurality of partitions according to the total area of all the parts in the parts group, each partition having rectangular shape and being related to a parts group;

(d) calculating a parts specific gravity of a undefined part, for each partition, by subtracting from the number of nets connecting between placed parts and the undefined part in the partition, the number of other nets connected to the undefined part, and by dividing the result of subtracting by the area of the undefined part;

(d') determining a first one-dimensional parts placement by placing un-placement parts nearby the placed part on a first one-dimensional axis in a descending order of the parts specific gravity;

(e) determining a second one-dimensional parts placement by placing the undefined parts nearby the placed part on a second one-dimensional axis perpendicular to the first one-dimensional axis in the descending order of the parts specific gravity; and (f) determining parts placement on a two-dimensional plane by placing, for each partition, the undefined parts on a two-dimensional plane using the first one-dimensional parts placement and the second one-dimensional parts placement.

15. The method of claim 14, wherein the step of inputting includes the step of, when the number of nets connecting one of the undefined parts to other parts is larger than the number of the other nets connecting between other parts, produces a cluster, producing a cluster including a set of the undefined part and the other parts connected to the undefined part, and the step of determining parts placement comprises the steps of:

subdividing the parts included in the cluster, after the cluster is placed similarly to the parts;

deriving divided zones by dividing each partition; and placing the part to be stored in the divided zone near the center of the divided zone.

16. The method of claim 14, the method further comprising the steps of:

calculating parts specific gravities of parts being not included in the parts group derived by the deriving step; and adding the parts to the parts group in descending order of its parts specific gravity.

17. The method of claim 14, the step of determining parts placement comprising the steps of:

deriving any shape of quadrilateral including a set of parts placed on an XY coordinate two-dimensional plane; and mapping the quadrilateral to a rectangular shape in the partition and mapping the positions of the parts and the quadrilateral in the partition.

18. The method of claim 14, the step of determining parts placement comprising the steps of:

dividing the parts group in the partition into a plurality of parts or parts groups in horizontal and vertical direction;

dividing the partition into a plurality of divided zones with vertical and horizontal division lines according to the area of the divided part or parts group;

dividing the parts group until all the parts are each included in a single divided zone; and placing the part in the center of the divided zone.

19. The method of claim 14, wherein the step of producing a partition comprises the steps of:

producing divided zones by equally dividing the partition in the direction of two-dimensional coordinate axes which are perpendicular to each other;

determining attractive force directed to a part zone by calculating adjacent force which is the number of nets connecting the part to other parts in the zones next to the part, by calculating, for each net connecting the part to other parts in the zones not next to the part, unit vector directed to the direction of the connected part, by calculating divergence vector which is the sum of the unit vector, and by calculating the part's attractive force to the part zone which is determined by subtracting an absolute value of the divergence vector from the adjacent force; and moving the part to other zone in ascending order of the attractive force when a plurality of parts resides in a single divided zone.

20. The method of claim 14 comprising the steps of:

determining the divided zone which has stronger attractive force when the part is moved to a next divided zone; and moving the part to the determined zone.

21. The method of claim 14, wherein the step of inputting comprises the steps of inputting net name data of designated bus wiring; and the method further comprises the steps of:

determining a cluster including a set of parts which connect to the designated bus wiring, and producing part data storing relative positions of the parts in the first one-dimensional parts placement as relative positions of parts in the cluster; and calculating parts placement with keeping the relative position of the parts in the cluster.

22. A recording medium readable by a computer, tangibly embodying a program of instructions executable by the computer to perform a method of automatically placing parts, the method comprises the steps of:

(a) inputting net data of a net connecting between terminals of parts, parts data, and position data of position designated parts;

(b) deriving parts group from a plurality of parts;

(c) producing a partition by dividing a parts placement zone into a plurality of partitions according to the total area of all the parts in the parts group, each partition having rectangular shape and being related to a parts group;

(d) calculating a parts specific gravity of a undefined part, for each partition, by subtracting from the number of nets connecting between placed parts and the undefined part in the partition, the number of other nets connected to the undefined part, and by dividing the result of subtracting by the area of the undefined part;

(d') determining a first one-dimensional parts placement by placing un-placement parts nearby the placed part on a first one-dimensional axis in descending order of the parts specific gravity;

(e) determining a second one-dimensional parts placement by placing the undefined parts nearby the placed part on a second one-dimensional axis perpendicular to the first one-dimensional axis in the descending order of the parts specific gravity; and (f) determining parts placement on a two-dimensional plane by placing, for each partition, the undefined parts on a two-dimensional plane using the first one-dimensional parts placement and the second one-dimensional parts placement.

23. The recording medium of claim 22, wherein the step of inputting comprises the step of, (a-1) when the number of nets connecting one of the undefined parts to other parts is larger than the number of the other nets connecting between other parts, produces a cluster, producing a cluster including a set of the undefined part and the other parts connected to the undefined part, and the step of determining parts placement comprises the steps of:

(a-2) subdividing the parts included in the cluster, after the cluster is placed similarly to the parts;

(a-3) deriving divided zones by dividing each partition; and (a-4) placing the part to be stored in the divided zone near the center of the divided zone.

24. The recording medium of claim 22, wherein the step of deriving parts comprises the steps of:

(b-1) calculating parts specific gravities of parts being not included in the parts group; and (b-2) adding the parts to the parts group in descending order of its parts specific gravity.

25. The recording medium of claim 22, wherein the step of determining parts placement comprises the steps of:

(f-1) deriving any shape of quadrilateral including a set of parts placed on the XY coordinate two-dimensional plane; and (f-2) mapping the quadrilateral to a rectangular shape in the partition and mapping the positions of the parts and the quadrilateral in the partition.

26. The recording medium of claim 22, wherein the step of determining parts placement comprises the steps of:

(g-1) dividing the parts group in the partition into a plurality of parts or parts groups in horizontal and vertical direction;

(g-2) dividing the partition into a plurality of divided zones with vertical and horizontal division lines according to the area of the divided part or parts group;

(g-3) dividing the parts group until all the parts are each included in a single divided zone; and (g-4) placing the part in the center of the divided zone.

27. The recording medium of claim 22, wherein the step of producing a partition comprises the steps of:

(c-1) producing divided zones by equally dividing the partition in the direction of two-dimensional coordinate axes which are perpendicular to each other;

(c-2) determining attractive force directed to a part zone by calculating adjacent force which is the number of nets connecting the part to other parts in the zones next to the part, by calculating, for each net connecting the part to other parts in the zones not next to the part, unit vector directed to the direction of the connected part, by calculating divergence vector which is the sum of the unit vector, and by calculating the part's attractive force to the part zone which is determined by subtracting an absolute value of the divergence vector from the adjacent force; and (c-3) moving the part to an other zone in ascending order of the attractive force when a plurality of parts resides in a single divided zone.

28. The method of claim 14, wherein the step of determining parts placement comprises the steps of:
(g-5) determining the divided zone which has stronger attractive force when the part is moved to the next divided zone; and
(g-6) moving the part to the determined zone.

29. The recording medium of claim 22, wherein the step of inputting comprises the step of
(a-5) inputting net name data of designated bus wiring; and the method further comprises the steps of:
(h) determining a cluster including a set of parts which connected to the designated bus wiring, and producing part data storing relative positions of the parts in the first one-dimensional parts placement as relative positions of parts in the cluster; and
(i) calculating parts placement with keeping the relative position of the parts in the cluster.

30. The method of claim 14, wherein the step of determining the first one-dimensional parts placement further comprises the steps of:
(j-1) defining a line which passes through an upper left point in the partition and a lower right point in the partition as a first one-dimensional coordinate axis;
(j-2) calculating a Y-axis intercept of a first division line so that a first divided zone surrounded by a part of a top side of the partition and a part of a left side of the partition each of which includes an upper left point and the first division line which descends leftwards at a determined angle relative to the top side of the partition is equal to an occupied area of a first part;
(j-3) storing the Y-axis intercept as a division line position coordinate;
(j-4) calculating a gravity point of the first divided zone;
(j-5) determining a straight line which extends parallel to the first division line from the gravity point intersects;
(j-6) calculating y coordinate value (Y-axis intercept) of the straight line;
(j-7) storing the y coordinate value of the straight line as a one-dimensional parts placement position;
(j-8) calculating, for each part, a parts specific gravity on the first one-dimensional coordinate axis;
(j-9) selecting heaviest parts specific gravity among the calculated parts specific gravities of undefined parts and storing the part corresponding to the selected parts specific gravity to the first divided zone;
(j-10) calculating a Y-axis intercept of a second division line so that a second divided zone which is in the partition and between the first division line and the second division line which descends leftwards at a determined angle relative to the top side of the partition which is parallel to the first division line is equal to an occupied area of a second part;

(j-11) calculating, for each part, a parts specific gravity by dividing attracting force which attracts each part in the direction of the upper left on the first one-dimensional coordinate axis by an area of the second part;
(j-12) selecting the heaviest parts specific gravity among the calculated parts specific gravities of undefined parts and storing the part corresponding to the selected parts specific gravity to a second divided zone;
(j-13) repeating the steps j-10 through j-12 for the remaining parts; and
(j-14) storing a placement order of the parts on the first one-dimensional parts placement and the positions of the parts on the first one-dimensional parts placement.

31. The method of claim 14, wherein the step of determining the second one-dimensional parts placement further comprises the steps of:
(k-1) defining a line which passes through an upper right point in the partition and a lower left point in the partition as a second one-dimensional coordinate axis;
(k-2) calculating a Y-axis intercept of a first division line so that a first divided zone surrounded by a part of a top side of the partition and a part of a right side of the partition each of which includes the upper right point and the first division line which descends rightwards at a determined angle relative to the top side of the partition is equal to an occupied area of a first part;
(k-3) storing the Y-axis intercept as a division line position coordinate;
(k-4) calculating a gravity point of the first divided zone;
(k-5) determining a straight line which extends parallel to the first division line from the gravity point intersects;
(k-6) calculating a y coordinate value (Y-axis intercept) of the straight line;
(k-7) storing the y coordinate value of the straight line as a one-dimensional parts placement position;
(k-8) calculating, for each part, a parts specific gravity on the second one-dimensional coordinate axis;
(k-9) selecting heaviest parts specific gravity among the calculated parts specific gravities of undefined parts and storing the part corresponding to the selected parts specific gravity to the first divided zone;
(k-10) calculating a Y-axis intercept of a second division line so that a second divided zone which is in the partition and between the first division line and the second division line which descends rightwards at a determined angle relative to the top side of the partition and which is parallel to the first division line is equal to an occupied area of a second part;
(k-11) calculating, for each part, a parts specific gravity by dividing attracting force which attracts each part in the direction of the upper right on the second one-dimensional coordinate axis by an area of the second part;
(k-12) selecting the heaviest parts specific gravity among the calculated parts specific gravities of undefined parts and storing the part corresponding to the selected parts specific gravity to the second divided zone;
(k-13) repeating the steps k-10 through k-12 for the remaining parts; and (k-14) storing a placement order of the parts on the second one-dimensional parts placement and the positions of the parts on the second one-dimensional parts placement.

32. The method of claim 14, wherein the step of determining parts placement places a set of parts which are placed on the two-dimensional plane into the partition with reduction by a compaction process.

33. The system of claim 1, wherein the deriving unit derives the parts group based on a position designated part.

34. The method of claim 14, wherein the step of deriving the parts group derives the parts group based on a position designated part.

\* \* \* \* \*